US012660334B2

(12) United States Patent
Chen et al.

(10) Patent No.: US 12,660,334 B2
(45) Date of Patent: Jun. 16, 2026

(54) BACKSIDE DEEP TRENCH ISOLATION (BDTI) STRUCTURE FOR CMOS IMAGE SENSOR

(71) Applicant: Taiwan Semiconductor Manufacturing Company, Ltd., Hsinchu (TW)

(72) Inventors: Hsin-Hung Chen, Tainan City (TW); Dun-Nian Yaung, Taipei City (TW); Jen-Cheng Liu, Hsin-Chu City (TW); Feng-Chi Hung, Chu-Bei City (TW); Wen-Chang Kuo, Tainan City (TW); Hung-Wen Hsu, Tainan City (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 686 days.

(21) Appl. No.: 17/882,869

(22) Filed: Aug. 8, 2022

(65) Prior Publication Data

US 2023/0361149 A1    Nov. 9, 2023

Related U.S. Application Data

(60) Provisional application No. 63/337,739, filed on May 3, 2022.

(51) Int. Cl.
*H10F 39/00*    (2025.01)
*H10F 39/18*    (2025.01)

(52) U.S. Cl.
CPC ......... *H10F 39/024* (2025.01); *H10F 39/807* (2025.01); *H10F 39/18* (2025.01); *H10F 39/813* (2025.01)

(58) Field of Classification Search
CPC ...... H10F 39/024; H10F 39/807; H10F 39/18; H10F 39/813
USPC ......................................................... 257/446
See application file for complete search history.

(56) References Cited

U.S. PATENT DOCUMENTS

| | | | |
|---|---|---|---|
| 9,508,769 | B1 | 11/2016 | Li et al. |
| 2002/0081809 | A1* | 6/2002 | Pinto ................. H01L 21/76264 |
| | | | 438/296 |
| 2012/0033119 | A1 | 2/2012 | Shinohara |
| 2014/0054662 | A1 | 2/2014 | Yanagita et al. |
| 2017/0047367 | A1 | 2/2017 | Lee et al. |
| 2018/0047766 | A1 | 2/2018 | Pyo et al. |

(Continued)

FOREIGN PATENT DOCUMENTS

KR        20040093227 A    11/2004

*Primary Examiner* — Norman D Richards
*Assistant Examiner* — Colin Russell McCutcheon
(74) *Attorney, Agent, or Firm* — Eschweiler & Potashnik, LLC

(57) ABSTRACT

In some embodiments, the present disclosure relates to a method for forming an image sensor and associated device structure. A backside deep trench isolation (BDTI) structure is formed in a substrate separating a plurality of pixel regions. The BDTI structure encloses a plurality of photodiodes and comprising a first BDTI component arranged at a crossroad of the plurality of pixel regions and a second BDTI component arranged at remaining peripheries of the plurality of pixel regions. The first BDTI component has a first depth from a backside of the substrate smaller than a second depth of the second BDTI component.

20 Claims, 21 Drawing Sheets

100E

(56)          References Cited

U.S. PATENT DOCUMENTS

| 2018/0175091 | A1 |   | 6/2018 | Jeon et al. |
| 2019/0148427 | A1 |   | 5/2019 | Lee |
| 2019/0252425 | A1 |   | 8/2019 | Ogawa |
| 2020/0176492 | A1 | * | 6/2020 | Huang ................ H10F 39/8023 |
| 2020/0243578 | A1 | * | 7/2020 | Pyo ..................... H10F 39/8053 |
| 2021/0193703 | A1 | * | 6/2021 | Watanabe .............. H10F 39/18 |
| 2022/0020790 | A1 |   | 1/2022 | Zang et al. |
| 2022/0109015 | A1 | * | 4/2022 | Jung ................... H10F 39/8063 |
| 2022/0244046 | A1 | * | 8/2022 | Yokogawa ........... H04N 25/705 |

* cited by examiner

100A

100B

100C

100D

100E

100F

200C

200D

400A

B

B'

106

102

103a

103b

103c

103d

400B

B

B'

103a

103d

106

106

106

102f

102

102b

500A

500B

700A

700B

800A

800B

800C

800D

900A

900B

900C

900D

1100A

1100B

B ———————————————————————————— B'

|←———103a———→|×|←———103d———→|

124
114
102b
112
124b      124a      124b
d2'
d1'      104        104
Δd
102
116
102f

1100C

1100D

1200A

1200B

1200C

1200D

1300A

1300B

1400

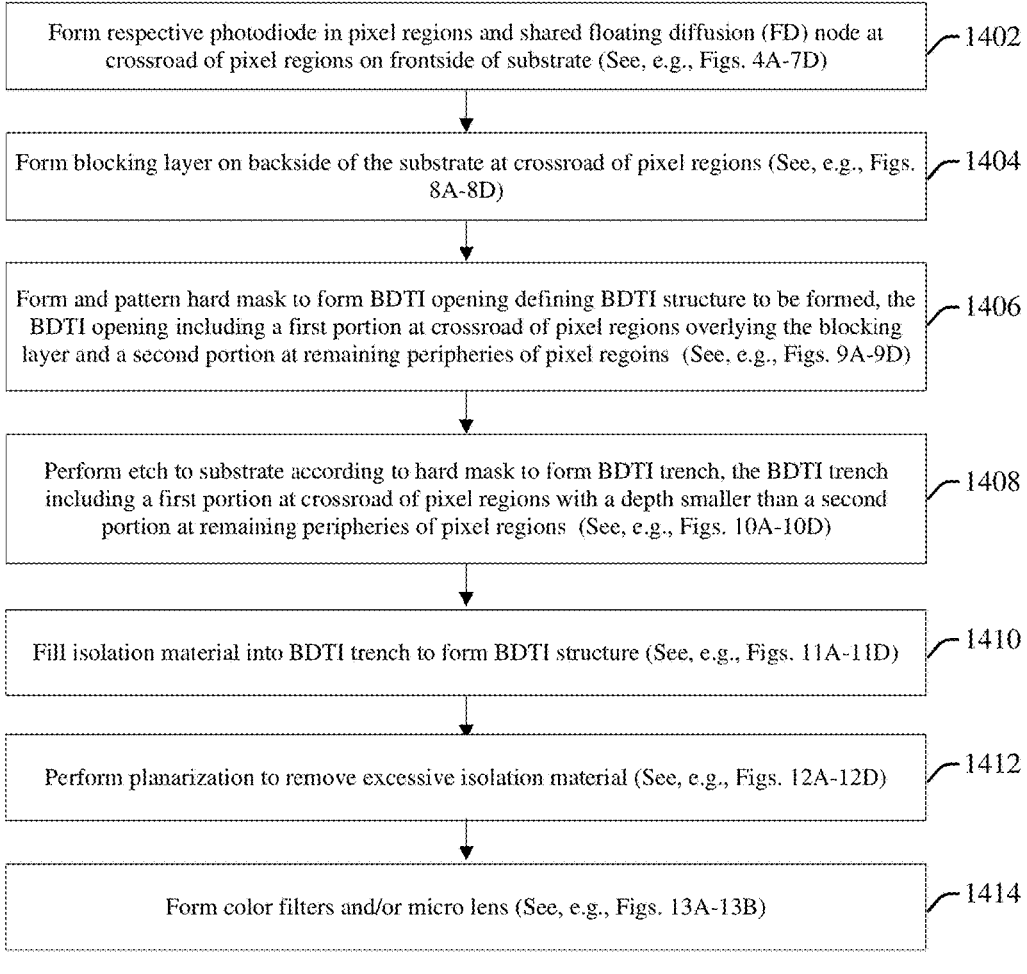

Form respective photodiode in pixel regions and shared floating diffusion (FD) node at crossroad of pixel regions on frontside of substrate (See, e.g., Figs. 4A-7D)          1402

Form blocking layer on backside of the substrate at crossroad of pixel regions (See, e.g., Figs. 8A-8D)          1404

Form and pattern hard mask to form BDTI opening defining BDTI structure to be formed, the BDTI opening including a first portion at crossroad of pixel regions overlying the blocking layer and a second portion at remaining peripheries of pixel regoins  (See, e.g., Figs. 9A-9D)          1406

Perform etch to substrate according to hard mask to form BDTI trench, the BDTI trench including a first portion at crossroad of pixel regions with a depth smaller than a second portion at remaining peripheries of pixel regions  (See, e.g., Figs. 10A-10D)          1408

Fill isolation material into BDTI trench to form BDTI structure (See, e.g., Figs. 11A-11D)          1410

Perform planarization to remove excessive isolation material (See, e.g., Figs. 12A-12D)          1412

Form color filters and/or micro lens (See, e.g., Figs. 13A-13B)          1414

Fig. 14

BACKSIDE DEEP TRENCH ISOLATION (BDTI) STRUCTURE FOR CMOS IMAGE SENSOR

REFERENCE TO RELATED APPLICATION

This application claims the benefit of U.S. Provisional Application No. 63/337,739, filed on May 3, 2022, the contents of which are hereby incorporated by reference in their entirety.

BACKGROUND

Many modern day electronic devices, such as digital cameras and video cameras, contain image sensors to convert optical images to digital data. An image sensor comprises an array of pixel regions, and each pixel region contains a photodiode configured to capture optical signals (e.g., light) and convert it to digital data (e.g., a digital image). Complementary metal-oxide-semiconductor (CMOS) image sensors are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 illustrates a flow diagram of some embodiments of a method of forming an image sensor having a plurality of pixel regions separated from one another by a BDTI structure including first and second BDTI components.

DETAILED DESCRIPTION

Figure 1A:
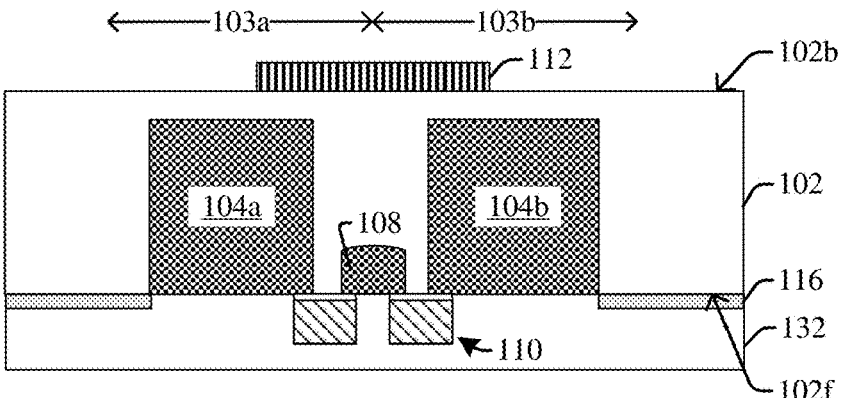
FIGS. 1A-1F illustrate a series of cross-sectional views of some embodiments of a method of forming a backside deep trench isolation (BDTI) structure including first and second BDTI components of different depths.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor includes a plurality of pixel regions arranged in an array. Each of the plurality of pixel regions may comprise a photodiode configured to convert incident light to charge carriers. A transfer gate is configured to control the flow of the converted charge carriers to a floating diffusion (FD) node, which then detects the incident light. The FD node is coupled to a plurality of transistors (e.g., a reset transistor, a source follower transistor, etc.) in a pixel device region. In a shared pixel layout, multiple pixel regions can share one FD node, and the FD node can be arranged at a boundary or a crossroad of neighboring pixel regions.

Sharing the same FD node by a plurality of pixel regions decreases a footprint size of the image sensor because adjacent pixel regions are arranged close to one another. However, by arranging pixel regions close to one another, the image sensor is at risk for optical and electrical cross-talk. An example of optical cross-talk is when optical data (e.g., light) enters a pixel region at an angle and crosses into an adjacent pixel region. An example of electrical cross-talk is when charge carriers in a photodiode migrate to an adjacent photodiode.

To prevent cross-talk, a backside deep trench isolation (BDTI) is arranged in a substrate to separate adjacent pixel regions from one another. A full BDTI, extending vertically through the substrate, provides for good electrical and optical isolation. However, in an image sensor with a shared pixel layout structure, the full BDTI may vertically extend to touch the FD node and/or other pixel devices and thus cause current leakage. Defects along an edge of the full BDTI may provide for leakage paths that put the image sensor at risk of pixel resolution reduction. This problem of the full BDTI is especially significant for the FD node that is arranged at the crossroad of pixel regions, since a lateral size of a backside trench is greater at the crossroad, allowing more etchant into the trench and increasing an etch rate at the crossroad of the pixel regions (which is also referred as microloading effect). Thus, the full BDTI may be deeper at the FD node as a natural result of the trench formation. Therefore, a significant depth margin is needed for the BDTI of a shared pixel layout structure, and optical and electrical cross-talk cannot be sufficiently prevented because of the needed depth margin.

In view of the above, the present disclosure relates to a method of forming a BDTI structure having a first BDTI component and a second BDTI component with different depths, and an associated image sensor device. The BDTI structure with different depths is configured to provide for optimal electrical and optical isolation between adjacent pixel regions. The image sensor may have a shared pixel layout structure with a plurality of photodiodes sharing a same FD node that is arranged at a crossroad of a plurality of pixel regions. The first BDTI component may be arranged at the crossroad with a first depth and vertically spaced from the FD node, such that a leakage path from the FD node can be alleviated. The second BDTI component may surround other peripheries of the plurality of pixel regions with a second depth greater than the first depth of the first BDTI component, such that it can provide for better isolation and improve cross-talk between adjacent pixel regions. In some embodiments, the first depth may be a full depth of a substrate of the image sensor device for a complete isolation.

As will be explained with more detailed examples below, in some embodiments, the BDTI structure is formed by forming and patterning a hard mask with a BDTI trench, performing an etch to deepen the BDTI trench into the substrate according to the hard mask, and filling the deepened BDTI trench with an isolation material. Prior to forming the BDTI trench, a blocking layer may be formed on a backside of the substrate to cover regions defined to be the first BDTI component. The blocking layer is subject to a smaller etch rate for one or more etching processes of the BDTI trench deepening. Thus, the deepening of a first portion of the BDTI trench corresponding to the first BDTI component is retarded, which results in a smaller depth of the first portion of the BDTI trench than a second portion of the BDTI trench defined to be the second BDTI component. By arranging the blocking layer for the formation of the first BDTI component, the first and second BDTI components of the BDTI structure can be formed by one photolithography process using one mask. Since the first and second BDTI components are defined using one mask, overlapping and misalignment issues are eliminated.

FIGS. 1A-1F illustrate a series of cross-sectional views 100A-100F of some embodiments of a method of forming a backside deep trench isolation (BDTI) structure 124 including first and second BDTI components 124a, 124b of different depths d1, d2.

Prior to forming the BDTI structure 124, a substrate 102 may be prepared from a frontside 102f. A first photodiode 104a may be formed in a first pixel region 103a, and a second photodiode 104b may be formed in a second pixel region 103b adjacent to the first pixel region 103a. The first photodiode and the second photodiode are of a first doping type, for example, an n-type. A floating diffusion (FD) node 108 of the first doping type may be formed from the frontside 102f of the substrate 102 between the first photodiode 104a and the second photodiode 104b. The first and second pixel regions 103a and 103b may share the FD node 108. A transfer gate 110 may respectively be formed between each of the photodiode 104 and the FD node 108. The transfer gate 110 is configured to control current flow between the photodiode 104 and the FD node 108. The transfer gate 110 may comprise a gate electrode and a gate dielectric that are disposed along the frontside 102f of the substrate 102. The transfer gate 110 may vertically extend in the substrate for better control of the current flow. The gate electrode may comprise, for example, doped polysilicon, a conductive metal (e.g., aluminum), or the like. The gate oxide may comprise a high-k dielectric, an oxide (e.g., such as silicon dioxide), or the like.

In some embodiments, an etch stop layer 116 is formed lining the frontside 102f of the substrate 102. The etch stop layer 116 may be configured to provide for etching stop of the second BDTI component 124b to be formed (see, for example, FIG. 1C, FIG. 1D). In some embodiments, the etch stop layer 116 may be patterned to at least cover areas where the second BDTI component 124b to be formed. Alternatively, the etch stop layer 116 may be formed contouring an upper surface of the frontside 102f of the substrate 102 and sidewalls and upper surfaces of the transfer gates 110. An inter-layer dielectric (ILD) layer 132 may be formed over the etch stop layer 116. Conductive contacts and metal interconnect layers (not shown) may be subsequently formed through the ILD layer and/or the etch stop layer 116 for the transfer gate 110 and the FD node 108.

Figure 1B:
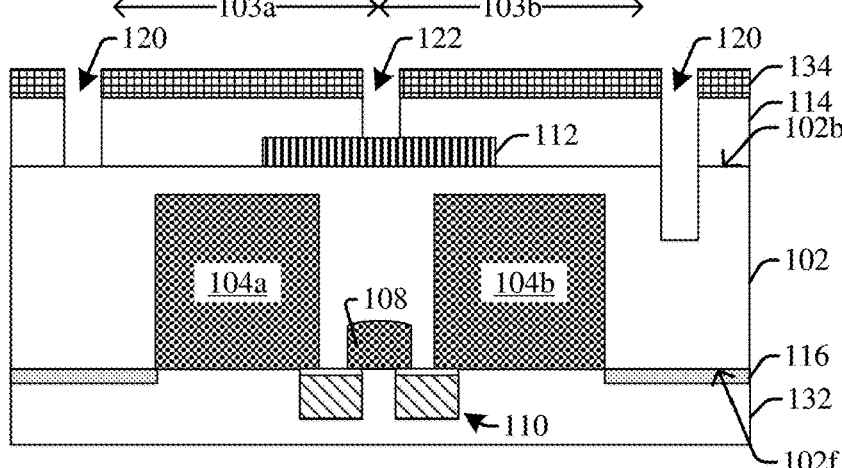
Figure 1C:
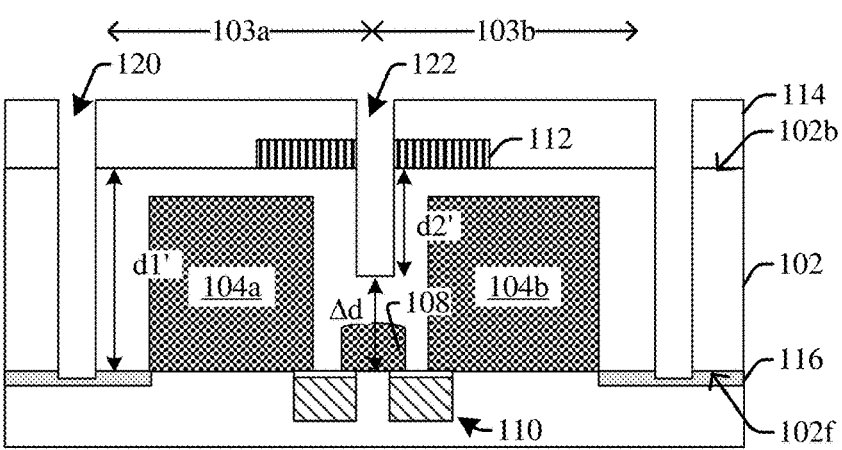
Figure 1D:
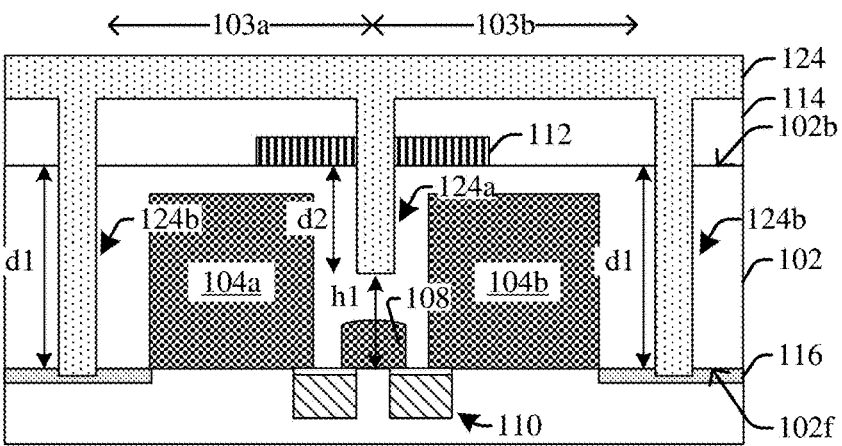
Figure 1E:
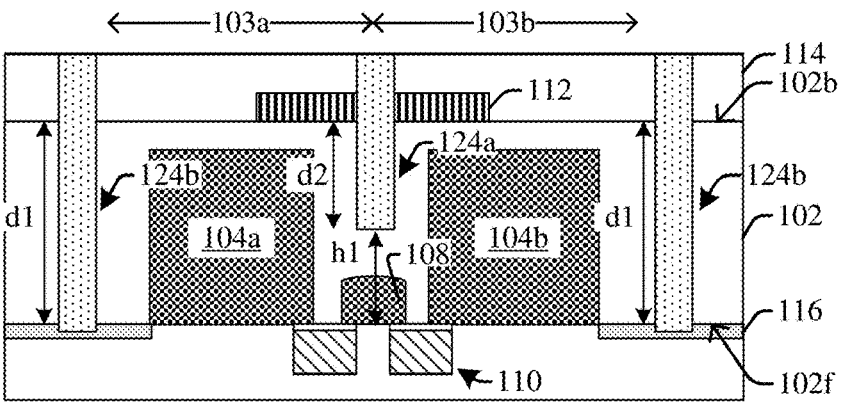
Figure 1F:
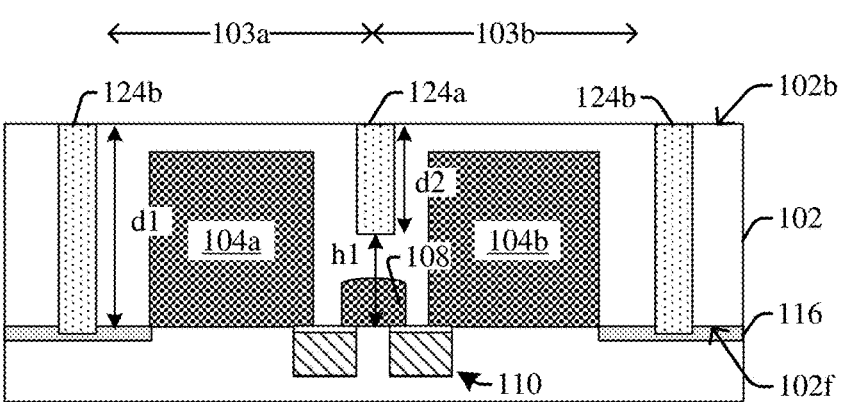

As shown in the cross-sectional view 100A of FIG. 1A, in some embodiments, a blocking layer 112 is formed and patterned on a backside 102b of the substrate 102 to cover regions defined to be the first BDTI component 124a (referring to FIGS. 1D-1F). The blocking layer 112 may be formed overlying the FD node 108.

As shown in the cross-sectional view 100B of FIG. 1B, in some embodiments, a hard mask 114 is formed over the blocking layer 112. The hard mask 114 is subsequently patterned to form a BDTI trench having a first portion 122 directly above the blocking layer 112 and a second portion 120 at opposite sides of the pixel regions 103a, 103b defined to be the second BDTI component 124b (referring to FIGS. 1D-1F). The first portion 122 and the second portion 120 of the BDTI trench may be defined using one photolithography process to pattern the hard mask 114 correspondingly for the first and second BDTI components of the BDTI structure. Thereby, overlapping and misalignment issues are eliminated.

As shown in the cross-sectional view 100C of FIG. 1C, in some embodiments, an etch is performed to deepen the BDTI trench into the substrate 102 according to the hard mask 114. Since the blocking layer 112 is subject to a smaller etch rate, the deepening of a first portion 122 of the BDTI trench is retarded by the blocking layer 112 comparing to the deepening of a second portion 120 of the BDTI trench. As a result, the first portion 122 of the BDTI trench is formed with a first depth d1' smaller than a second depth d2' of the second portion 120. Thus, the first portion 122 can be formed vertically spaced apart from the FD node 108 while the second portion 120 can be formed deeper for a better isolation of neighboring pixel regions. In some embodiments, the second portion 120 may be formed through the substrate 102 to have a full vertical depth of the substrate 102. The etch of the second portion 120 may be stopped by the etch stop layer 116.

In some embodiments, the etch has different etch rates for the blocking layer 112 and the substrate 102. An etch rate is defined as a removal depth the etch achieves in a period of time. In some embodiments, an etch rate ratio of the BDTI trench etch of the substrate 102 and the blocking layer 112 may be in a range of from about 10:1 to about 30:1. A small etch rate ratio, such as an etch rate smaller than 10:1 may result insufficient depth difference Δd or a thick thickness of the blocking layer. A large etch rate ratio, such as an etch rate greater than 30:1 may result coarse control of the depth difference Δd.

As shown in the cross-sectional view 100D of FIG. 1D, in some embodiments, an isolation material is fill into the deepened BDTI trench to form BDTI structure 124 with the first and second BDTI components 124a, 124b of different depths d1, d2. By arranging the blocking layer 112 prior to the forming and patterning of the hard mask 114, the first and second BDTI components 124a, 124b of the BDTI structure 124 can be formed by one photolithography process. Since the first and second BDTI components 124a, 124b are defined using one mask and one photolithography process, overlapping and misalignment issues are eliminated.

After filling the isolation material, a planarization process may be performed to remove excessive isolation material to form a planar upper surface. In some embodiments, the isolation material is reduced for planarization but still overlies the hard mask 114, the blocking layer 112, and the plurality of photodiodes 104 after the planarization. The resulted device structure can be illustrated by FIG. 1D with a suitable thickness of the BDTI structure 124 above the hard mask 114.

As shown in the cross-sectional view 100E of FIG. 1E, in some additional embodiments, the planarization process is performed to remove the isolation material from overlying the photodiode 104. The hard mask 114 and/or the blocking layer 112 may be partially or completely removed to allow for radiation to better reach the photodiode 104. FIG. 1E shows an example device structure where the hard mask 114 overlies the blocking layer 112. The first and second BDTI components 124a, 124b may have upper surfaces aligned with that of the hard mask 114. Though not show by figures, additionally or alternatively, the planarization process may further lower the hard mask 114 and stop on the blocking layer 112, such that the first and second BDTI components 124a, 124b have upper surfaces aligned with that of the blocking layer 112.

As shown in the cross-sectional view 100F of FIG. 1F, in some additional embodiments, the planarization process is performed to further reduce the isolation material and remove the hard mask 114 and the blocking layer 112 to allow for radiation to better reach the photodiode 104. As such, the first and second BDTI components 124a, 124b may have upper surfaces aligned with that of the backside 102b of the substrate 102.

In some embodiments, though not shown in the figures, an anti-reflective layer and color filters can be subsequently formed on the backside 102b of the substrate 102 corresponding to the pixel regions 103a, 103b. The color filter is configured to allow for the transmission of radiation having a specific range of wavelength while blocking light of wavelengths outside of the specified range. A color filter isolation structure, such as a composite grid, may be formed separating the color filters for isolation purpose. In addition, micro-lenses may be formed over the color filters.

During operation, incident radiation pass through the micro-lenses and the color filters to hit the backside 102b of the substrate 102 and passes from the backside 102b of the substrate 102 to the photodiode 104. The photodiode 104 is configured to convert the incident radiation (e.g., photons) into an electric signal (i.e., to generate electron-hole pairs from the incident radiation). It isolates the pixel regions 103a, 103b while still prevents leakage of the electrical signal from the FD node 108 by having the first BDTI component 124a with the first depth d1 overlying and spaced apart from the FD node 108. It provides for optimal isolation between the pixel regions 103a, 103b and adjacent pixel regions by having the second BDTI component 124b with the second depth d2 greater than the first depth d1 (e.g. with a full depth of the substrate 102), arranged at remaining peripheral regions between the pixel regions 103a, 103b and at outside boundaries of the pixel regions 103a, 103b, FIGS. 2A-2D illustrate top and cross-sectional views 200A-200D of some embodiments of an image sensor having a plurality of pixel regions 103a-103d separated and isolated by a BDTI structure 124 including first and second BDTI components 124a, 124b of different depths. Although four pixel regions 103a-103d are illustrated in the figures and described in the specification, it is appreciated that a different amount of pixel regions can be designed to share a FD node. A same pattern or multiple different patterns can be repeated to constitute a suitable number of pixel regions arranged for the image sensor.

Figure 2A:
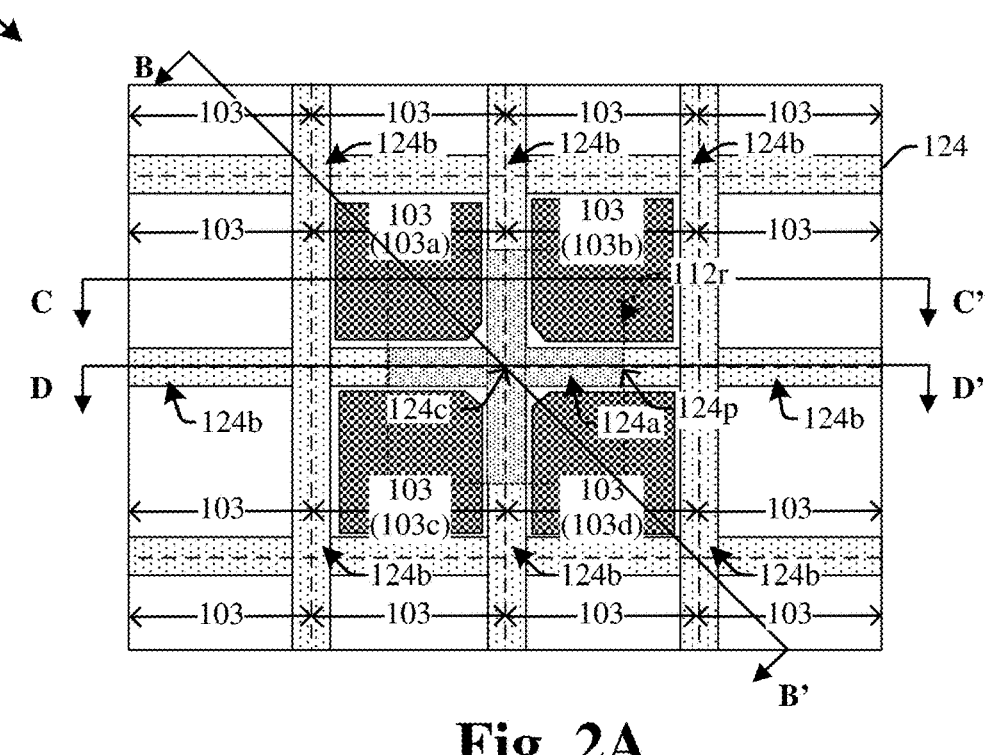
FIGS. 2A-2D illustrate top and cross-sectional views of some embodiments of an image sensor having a plurality of pixel regions separated by a BDTI structure including first and second BDTI components of different depths.

As shown in the top view 200A of FIG. 2A, the BDTI structure 124 separates pixel regions 103 of the image sensor. The BDTI structure 124 comprises the first BDTI component 124a disposed within a blocking region 112r and the second BDTI component 124b disposed at remaining peripheries of the plurality of pixel regions 103a-103d outside the blocking region 112r. In some embodiments, the blocking region 112r covers a crossroad of the plurality of pixel regions 103a-103d. The blocking region 112r may have a square or rectangular shape and may be centered by the crossroad of the plurality of pixel regions 103a-103d. The first BDTI component 124a may have a cross shape crossing at the crossroad region of the plurality of pixel regions 103a-103d.

Figure 2B:
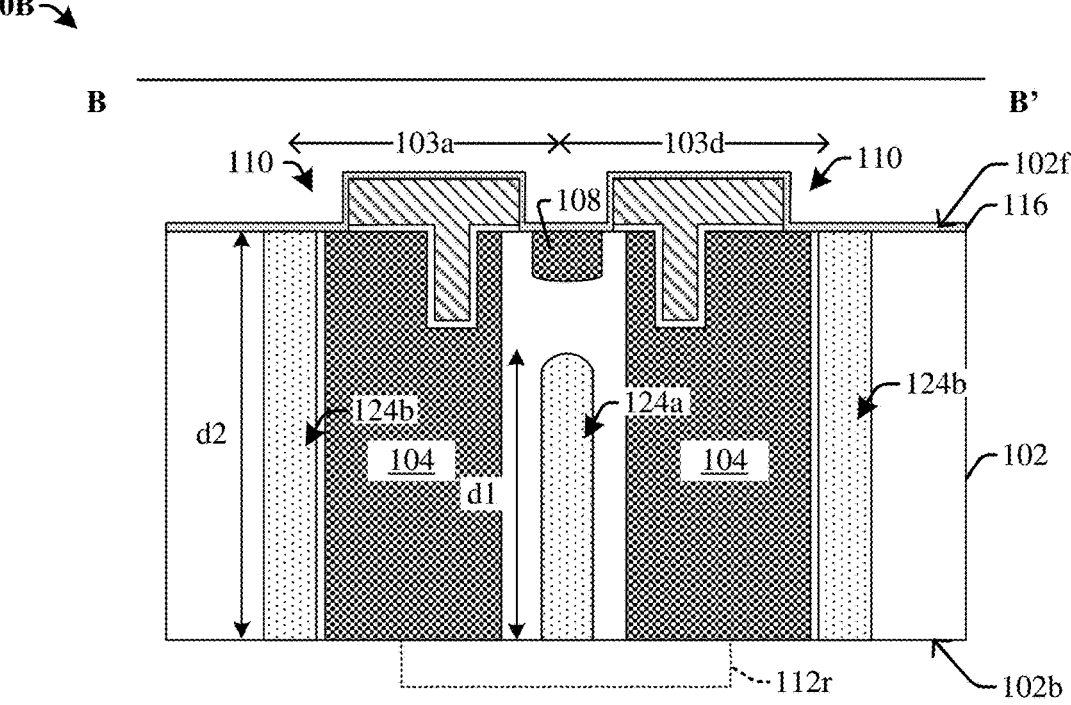
Figure 2C:
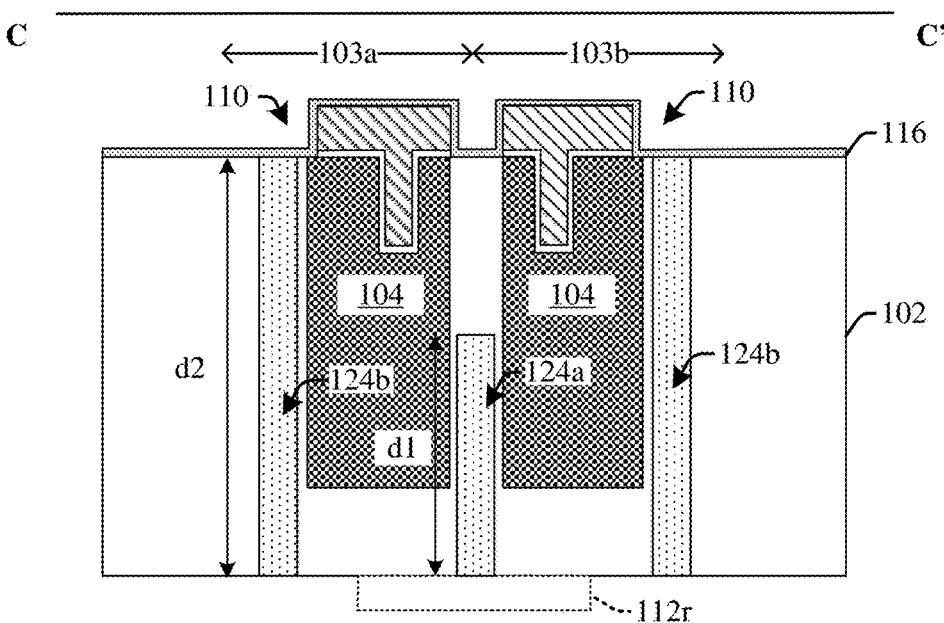

As shown in the cross-sectional views 200B and 200C of FIGS. 2B-2C taken respectively along lines B-B' and C-C' in FIG. 2A, in some embodiments, each pixel region 103 comprises a transfer gate 110 and a photodiode 104. The FD node 108 may be disposed on one side of the transfer gate 110 opposite the photodiode 104. The FD node 108 may be disposed at the crossroad of the plurality of pixel regions 103a-103d and shared by the plurality of pixel regions 103a-103d. The transfer gate 110 is configured to control current flow between the photodiode 104 and the FD node 108. The transfer gate 110 may comprise a gate electrode and a gate dielectric that are disposed along a frontside 102f of the substrate 102. The transfer gate 110 may vertically extend in the substrate for better control of the current flow. The gate electrode may comprise, for example, doped polysilicon, a conductive metal (e.g., aluminum), or the like. The gate oxide may comprise a high-k dielectric, an oxide (e.g., such as silicon dioxide), or the like.

Figure 2D:
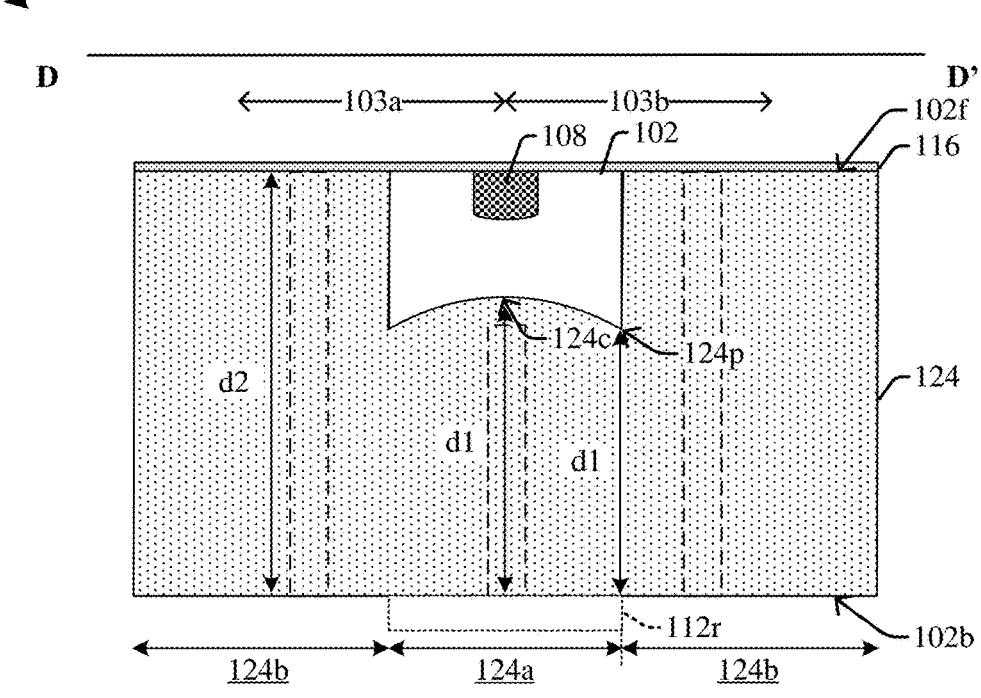

Also as shown in the cross-sectional views 200B-200D of FIGS. 2B-2D taken respectively along lines B-B', C-C', and D-D' in FIG. 2A, in some embodiments, the first BDTI component 124a and the second BDTI component 124b of the BDTI structure 124 extend from the backside 102b of the substrate 102 respectively to a first depth d1 and a second depth d2. The first depth d1 is smaller than the second depth d2. In some embodiments, the first depth d1 may be in a range of from 0.1 to 0.9 times of the second depth d2. The first BDTI component 124a may be disposed vertically spaced apart from the FD node 108. A distance between the FD node 108 and the first BDTI component 124a may be in a range of between from about 1 μm to about 9 μm, or in a range of from about 2 μm to 3 μm to prevent leakage from the FD node 108 while still providing optical and electrical isolation between the first pixel region 103a and the second pixel region 103b. A width of the first BDTI component 124a or the second BDTI component 124b may be in a range of between from about 40 nm to about 400 nm, or in a range of from about 100 nm to about 150 nm. In some embodiments, the first depth d1 of the first BDTI component 124a is in a range of from about 0.1 μm and about 6 μm. In some embodiments, the second depth d2 of the second BDTI component 124b is in a range of from about 2 μm and about 10 μm.

In some embodiments, the second BDTI component 124b may be disposed through the substrate 102 with the second depth d2 being a full depth of the substrate 102. The first depth d1 of the first BDTI component 124a may be greater at the crossroad region of the plurality of pixel regions 103a-103d than remaining peripheral regions due to micro-loading effect. Thus the first depth d1 of the first BDTI component 124a may be greater as shown in FIG. 2B taken along the line B-B' crossing the crossroad region than as shown in FIG. 2C taken along the line C-C' crossing a remaining peripheral region of the pixel regions 103a, 103b.

In addition, as shown in FIG. 2D, in some embodiments, the first BDTI component 124a and the second BDTI component 124b are a continuous body along a BDTI line such as the line D-D' in FIG. 2A. The first BDTI component 124a has a convex shape with the first depth d1 monotonically decreases from a center region 124c to a peripheral region 124p of the cross shape of the first BDTI component 124a (referring to FIG. 2A and FIG. 2D). As described above, the center region 124c and the peripheral region 124p of the cross shape may correspond to a center region and a boundary region of the blocking region 112r. The first depth d1 of the first BDTI component 124a shown in the cross-sectional view 200C of FIG. 2C is taken along the line C-C' that crosses a middle point between the center region 124c to a peripheral region 124p of the cross shape of the first BDTI component 124a. Thus, the first depth d1 of the first BDTI component 124a shown in the cross-sectional view 200C of FIG. 2C is between the first depths d1 of the center region 124c and the peripheral region 124p of the first BDTI component 124a shown in the cross-sectional view 200D of FIG. 2D.

Figure 3A:
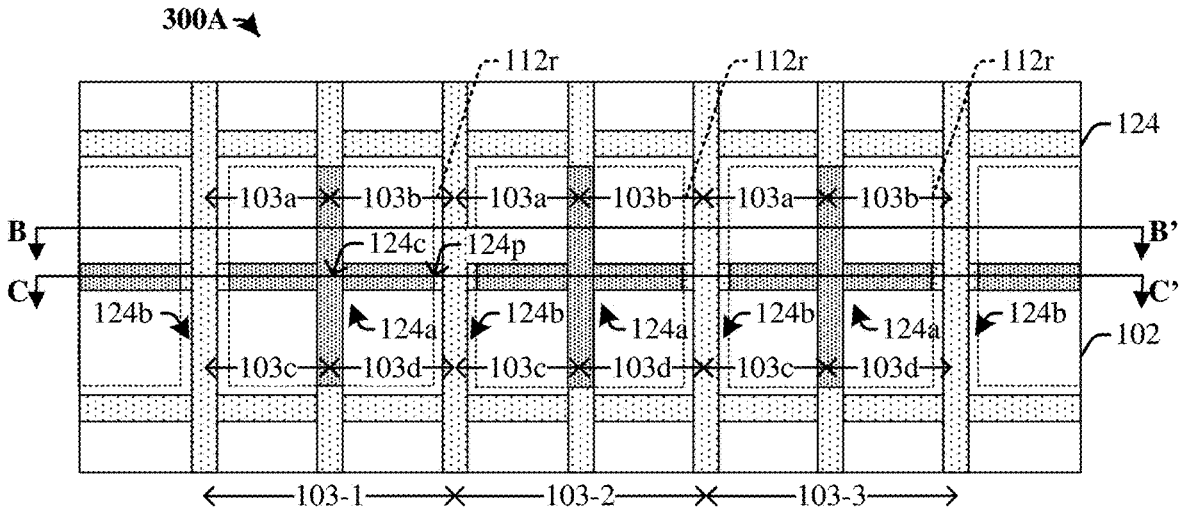
FIGS. 3A-3C illustrate top and cross-sectional views of some embodiments of an image sensor having an array of pixel regions separated by a BDTI structure including first and second BDTI components of different depths.
Figure 3B:
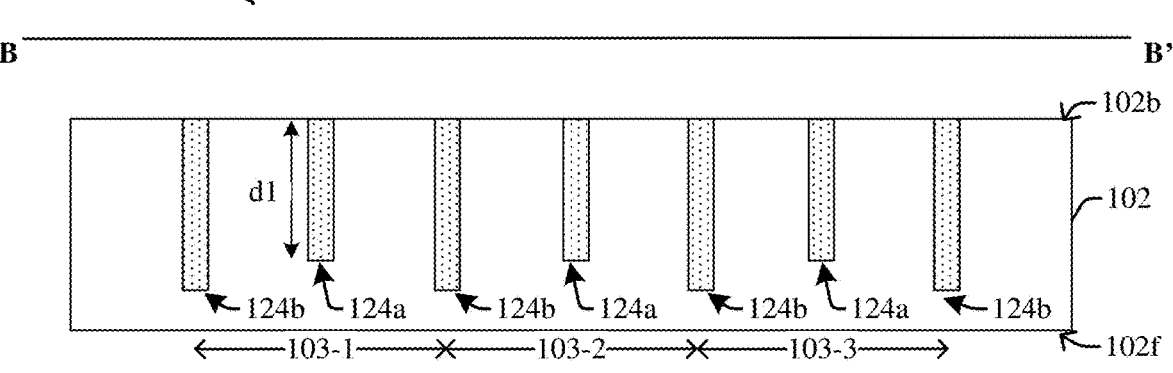
Figure 3C:
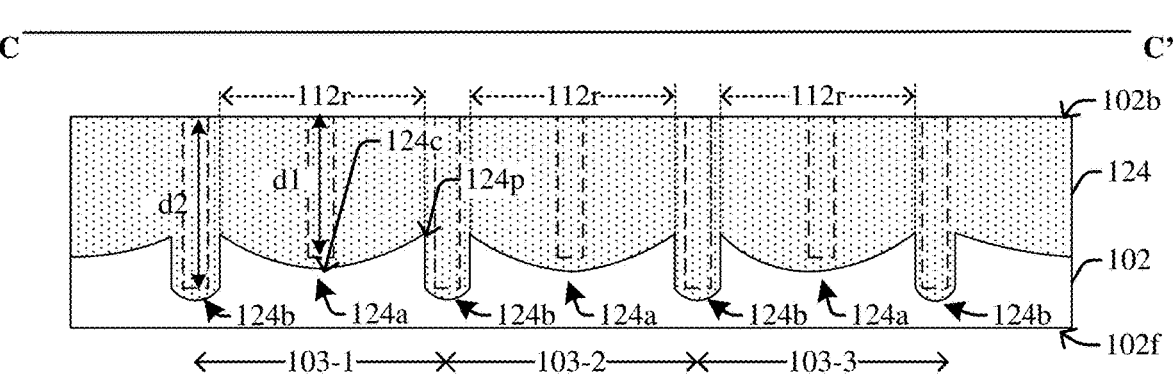

FIGS. 3A-3C illustrate top and cross-sectional views 300A-300C of some embodiments of an image sensor having an array of pluralities of pixel regions separated by a BDTI structure 124 disposed in a substrate 102 and including first and second BDTI components 124a, 124b of different depths d1, d2. The BDTI structure 124 is configured to provide for isolation of the neighboring pixel regions.

As an example, as shown in FIG. 3A, the image sensor may comprise pluralities of pixel regions such as 103-1, 103-2, 103-3 arranged in rows and columns or in other arrays. Each of the pluralities of pixel regions 103-1, 103-2, and 103-3 may comprise multiple pixel regions such as pixel regions 103a-103d that share a FD node (not shown). The FD node may be arranged at a crossroad of the multiple pixel regions 103a-103d. In some embodiments, a blocking region 112r is defined covering the crossroad of the multiple pixel regions 103a-103d. The blocking region 112r may have a square or rectangular shape and may be centered by the crossroad of the plurality of pixel regions 103a-103d. In some embodiments, the BDTI structure 124 comprises the first BDTI component 124a disposed within the blocking region 112r and the second BDTI component 124b disposed at remaining peripheries of the plurality of pixel regions 103a-103d outside the blocking region 112r.

As shown in FIG. 3B, the first BDTI component 124a and the second BDTI component 124b of the BDTI structure 124 extend from the backside 102b of the substrate 102 respectively to a first depth d1 and a second depth d2. The first depth d1 is smaller than the second depth d2. The first BDTI component 124a may be vertically spaced apart from the FD node. In some embodiments, the second BDTI component 124b may be disposed through the substrate 102 with the second depth d2 being a full depth of the substrate 102. Having the second BDTI component 124b with the second depth d2 greater than the first depth d1, an optimal isolation between neighboring pixel regions is provided without causing current leakage of the FD node.

As shown in FIG. 3C, in some embodiments, along a BDTI line such as the C-C' line in FIG. 3A, the first depth d1 of the first BDTI component 124a may be greater at the crossroad region of the plurality of pixel regions 103a-103d than remaining peripheral regions due to microloading effect. Thus, the first BDTI component 124a may a convex shape with the first depth d1 monotonically decreases from a center region 124c to a peripheral region 124p of the cross shape of the first BDTI component 124a (referring to FIGS. 3A and 3C). The center region 124c and the peripheral region 124p of the cross shape may correspond to a center region and a boundary region of the blocking region 112r.

In addition, the first depth d1 of the first BDTI component 124a shown in the cross-sectional view 300B of FIG. 3B is taken along the line B-B' that crosses a middle point between the center region 124c and the peripheral region 124p of the cross shape of the first BDTI component 124a. Thus, the first depth d1 of the first BDTI component 124a shown in the cross-sectional view 300B of FIG. 3B may be between the first depths d1 of the center region 124c and the peripheral region 124p of the first BDTI component 124a shown in the cross-sectional view 300C of FIG. 3C.

FIGS. 4A-13B illustrate cross-sectional views 400A-1300B of some embodiments of a method of forming an image sensor having a BDTI structure including first and second BDTI components isolating adjacent pixel regions from one another. Although FIGS. 4A-13B are described in relation to a method, it will be appreciated that the structures disclosed in FIGS. 4A-13B are not limited to such a method, but instead may stand alone as structures independent of the method.

FIGS. 4A-7D show some examples of preparing a substrate 102 from a frontside 102f to form various doped regions and gate structures along the frontside 102f of the substrate 102. As shown by more detailed examples below, in some embodiments, a plurality of photodiodes 104 of a first doping type (e.g., n-type) is formed correspondingly within a plurality of pixel regions 103a-103d. A shared FD node 108 of the first doping type may be formed at a crossroad region of the plurality of pixel regions 103a-103d. A plurality of transfer gate 110 may be formed correspondingly between the plurality of photodiodes 104 and the FD node 108.

In various embodiments, the substrate 102 may comprise any type of semiconductor body (e.g., silicon/CMOS bulk, SiGe, etc.) such as a semiconductor wafer or one or more die on a wafer, as well as any other type of semiconductor and/or epitaxial layers formed thereon and/or otherwise associated therewith. The substrate 102 may be prepared with a first doping type (e.g. p-type), by a blanket implant or a grading epitaxial growth process, for example.

Figure 4A:
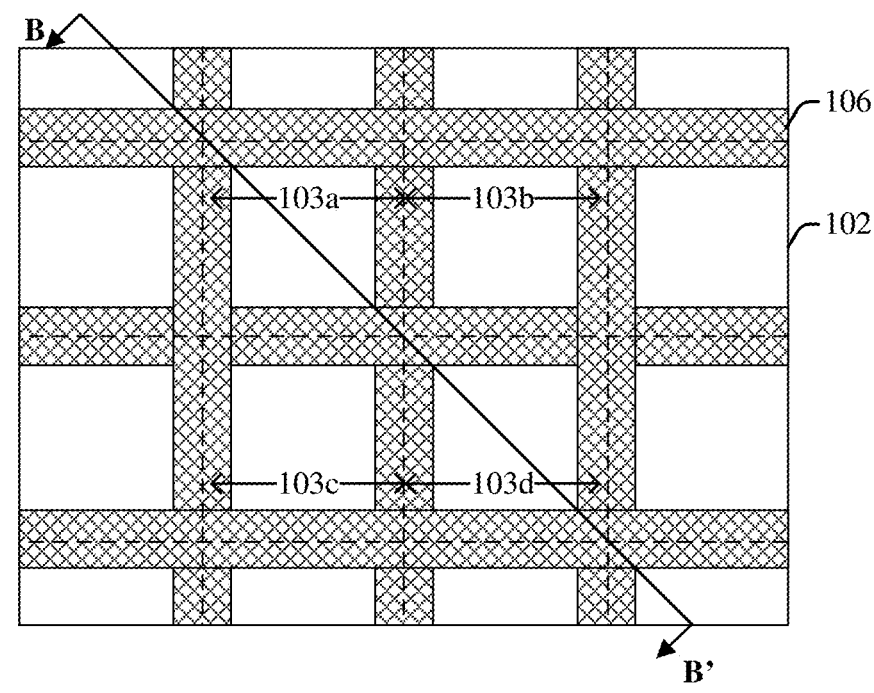
FIGS. 4A-13B illustrate top and cross-sectional views of some embodiments of a method of forming an image sensor having a plurality of pixel regions separated from one another by a BDTI structure including first and second BDTI components of different depths.
Figure 4B:
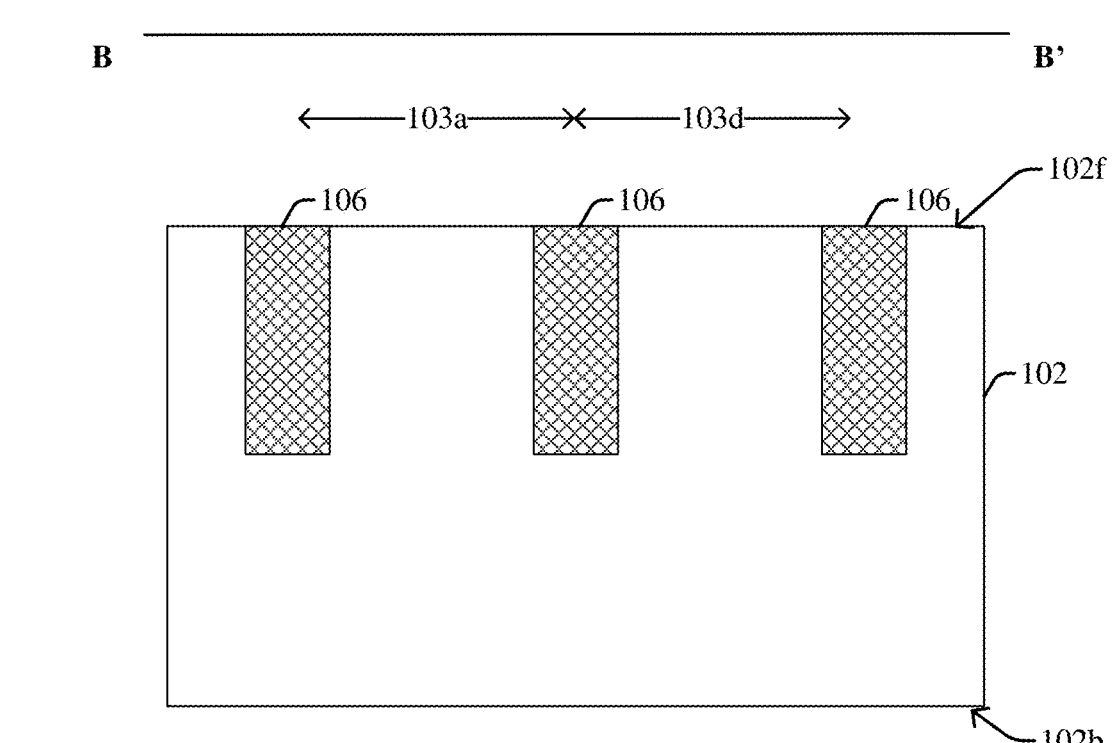

As shown in a top view 400A of FIG. 4A and a cross-sectional view 400B of FIG. 4B taken along line B-B' in the top view 400A, in some embodiments, an isolation well 106 is formed along the frontside 102f of the substrate 102 separating the plurality of pixel regions 103a-103d. The isolation well 106 may be formed by selectively performing an implantation process of a second doping type (e.g., p-type) into the substrate 102 with a masking layer in place to form doped isolation regions. In some embodiments, a shallow trench isolation (STI) (not shown) may also be formed along the frontside 102f of the substrate 102 separating the plurality of pixel regions 103a-103d. The STI structure may be formed by selectively etching the substrate from the frontside 102f to form a shallow trench and subsequently forming an oxide or other dielectric material within the shallow trench. The isolation well 106 may be formed from frontside 102f of the substrate 102 to a position deeper than the STI structure. The isolation well 106 may be centrally aligned with the STI structure.

Figures 5A, 5B:
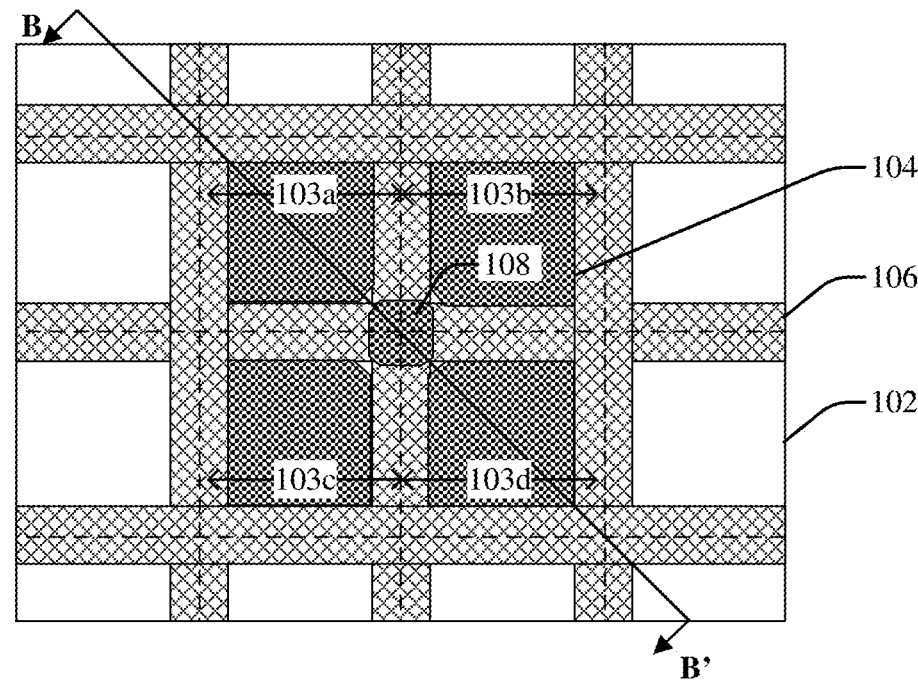

As shown in a top view 500A of FIG. 5A and a cross-sectional view 500B of FIG. 5B taken along line B-B' in the top view 500A, in some embodiments, the photodiode 104 is formed within each of the plurality of pixel regions 103a-103d. The photodiode 104 may comprise doped regions of the first doping type (e.g., n-type) and may be formed by an implantation process. The photodiode 104 may comprise multiple doped layers of different doping concentration, and sidewalls of the multiple doped layers are not necessarily aligned. In some alternative embodiments, the photodiode 104 may also be formed by an epitaxial process to form blanket doped layers followed by forming various insolation structures. In addition, the FD node 108 may be formed by doping a portion of the substrate 102 from the frontside 102f of the substrate 102 to have the first doping type (e.g., n-type). In some embodiments, the FD node 108 has a higher doping concentration than the photodiode 104. A portion of the isolation well 106 may separate the FD node 108 from the photodiode 104 and the substrate 102.

Figure 6A:
Figure 6A:
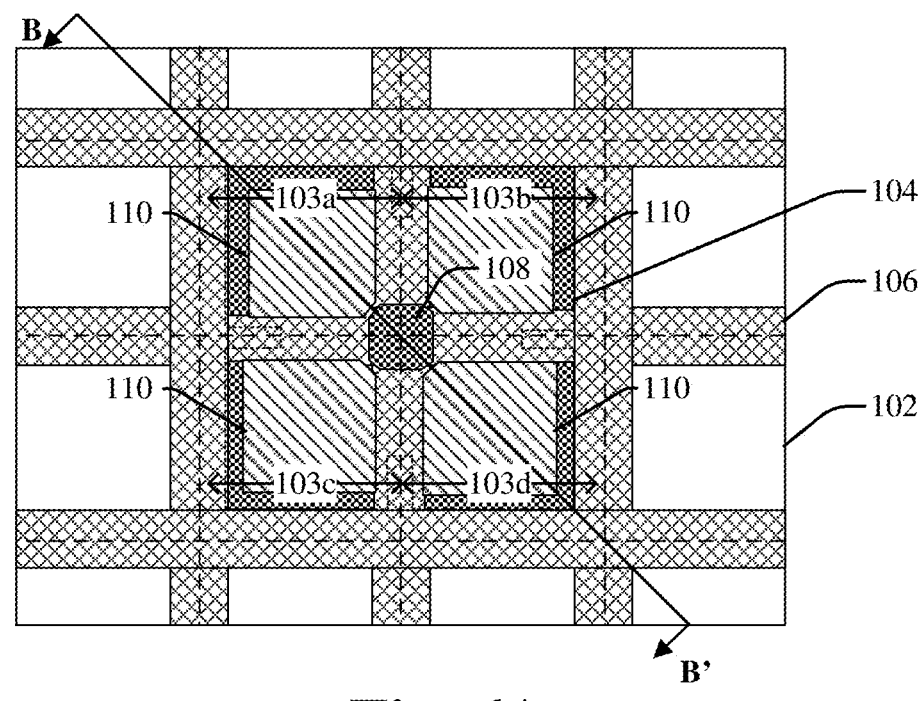
Figure 6B:
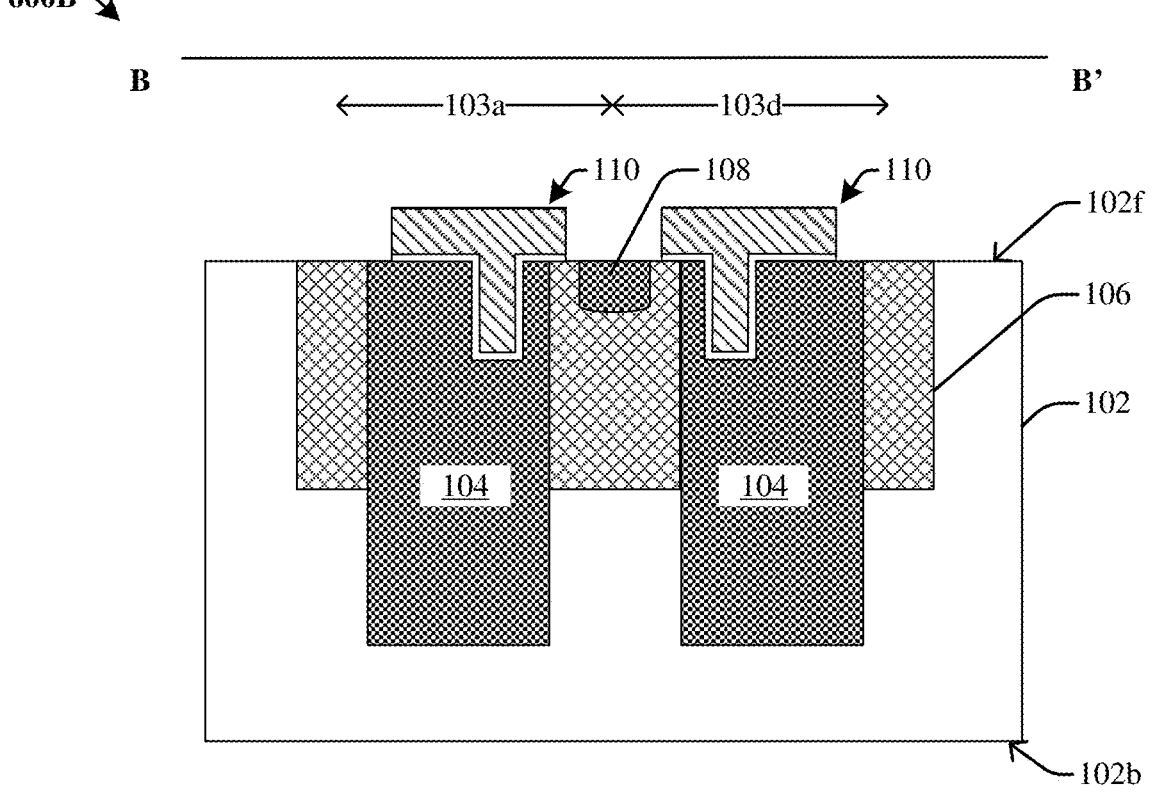

As shown in a top view 600A of FIG. 6A and a cross-sectional view 600B of FIG. 6B taken along line B-B' in the top view 600A, in some embodiments, a plurality of transfer gates 110 is formed correspondingly between the plurality of photodiodes 104 and the FD node 108. The transfer gate 110 may be formed by depositing a gate dielectric film and a gate electrode film over the substrate 102. The gate dielectric film and the gate electrode film are subsequently patterned to form a gate dielectric layer and a gate electrode. The transfer gate 110 may be a vertical gate extending into the photodiode 104. A gate sidewall spacer (not shown) may be formed on a sidewall of the transfer gate 110. The transfer gate 110 may be formed such that it overlies portions of the photodiode 104, the isolation well 106, and/or the FD node 108.

Figure 7A:
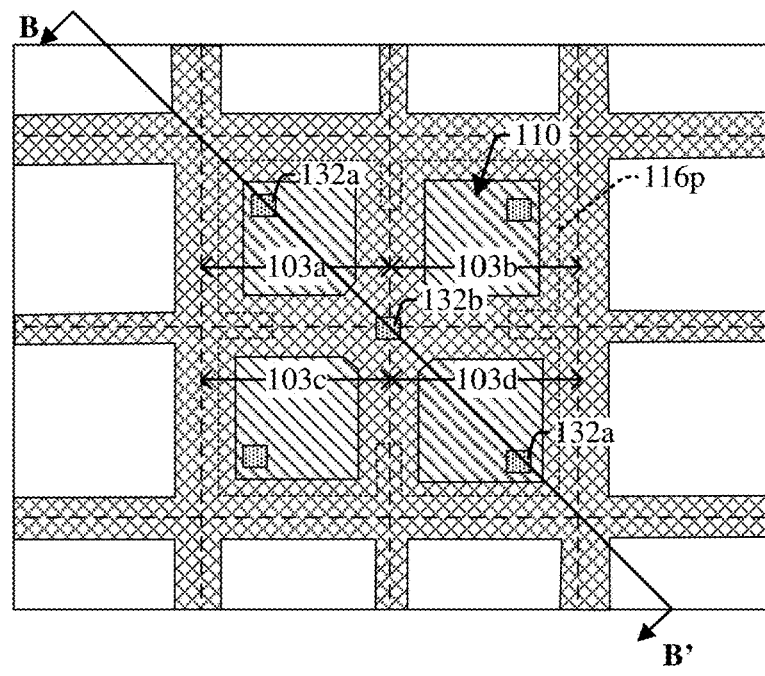
Figure 7B:
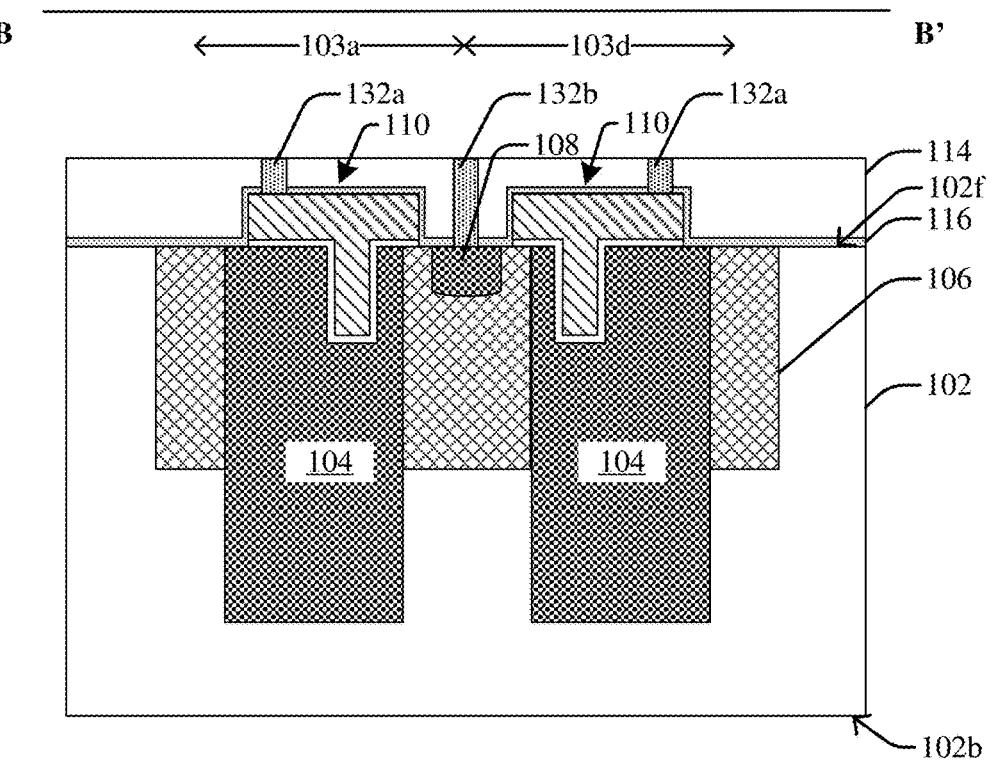

As shown in a top view 700A of FIG. 7A and a cross-sectional view 700B of FIG. 7B taken along line B-B' in the top view 700A, in some embodiments, an etch stop layer 116 is formed over the frontside 102f of the substrate 102. In some embodiments, the etch stop layer 116 may comprise a nitride (e.g., silicon nitride), a carbide (e.g., silicon carbide), an oxide (e.g., silicon dioxide), or the like. The etch stop layer 116 may be configured to provide for etching stop of the second BDTI component to be formed (see, for example, FIG. 10B, FIG. 11B). In some embodiments, the etch stop layer 116 is formed contouring an upper surface of the frontside 102f of the substrate 102 and sidewall and upper surfaces of the plurality of transfer gates 110. Then, an inter-layer dielectric (ILD) layer 132 is formed over the etch stop layer 116, and conductive contacts such as gate contact 142a and FD node contact 142b can be formed through the ILD layer 132 and the etch stop layer 116 coupled to the transfer gate 110 and the FD node 108.

In some alternative embodiments, the etch stop layer 116 may be patterned to cover areas where the second BDTI component to be formed. An example of a patterned etch stop layer 116p is shown in FIG. 7A, where the crossroad area of the plurality of pixel regions 103a-103d designed for the the first BDTI component can be exposed by the patterned etch stop layer 116p.

Though not shown in FIGS. 7A-7B, a metallization stack comprising metal interconnect layers arranged within additional ILD layers can be formed over the frontside 102f of the substrate 102. In some embodiments, the conductive contacts and the metallization stack may be formed by a damascene process (e.g., a single damascene process or a dual damascene process). Specifically, the ILD layers may be deposited and subsequently etched to form via holes and/or metal trenches. The via holes and/or metal trenches are then filled with a conductive material to form the conductive contacts and the metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electroless plating, etc.). In various embodiments, the plurality of metal interconnect layers may comprise tungsten, copper, or aluminum-copper, for example. The ILD layer can be then bonded to a handle substrate or another functional device (not shown). In some embodiments, the bonding process may use an intermediate bonding oxide layer arranged between the ILD layer and the handle substrate. In some embodiments, the bonding process may comprise a fusion bonding process.

FIGS. 8A-13B show some examples of flipping over the substrate 102 for further processing on a backside 102b that is opposite to the frontside 102f. As will be explained with more detailed examples below, in some embodiments, a blocking layer 112 is firstly formed and patterned on the backside 102b of the substrate 102 to cover regions defined to be the first BDTI component. A hard mask 114 is formed over the blocking layer 112 (FIGS. 8A-8D). The hard mask 114 is subsequently patterned to form a BDTI trench having a first portion 122 directly above the blocking layer 112 and a second portion 120 at remaining peripheries of the plurality of pixel regions 103a-103d defined to be the second BDTI component (FIGS. 9A-9D). Then, an etch is performed to deepen the BDTI trench into the substrate 102 according to the hard mask 114 (FIGS. 10A-10D). Since the blocking layer 112 is subject to a smaller etch rate, the deepening of a first portion 122 of the BDTI trench is retarded by the blocking layer 112. As a result, a smaller depth is achieved for the first portion 122 than the second portion 120, and the first portion 122 can be vertically spaced apart from the FD node 108. Then, an isolation material is fill into the deepened BDTI trench to form the BDTI structure 124 with the first and second BDTI components 124a, 124b of different depths (FIGS. 11A-11D). By arranging the blocking layer 112 prior to the forming and patterning of the hard mask 114, the first and second BDTI components 124a, 124b of the BDTI structure 124 can be formed by one photolithography process using one mask. Since the first and second BDTI components 124a, 124b are defined using one mask, overlapping and misalignment issues are eliminated.

Figure 8A:
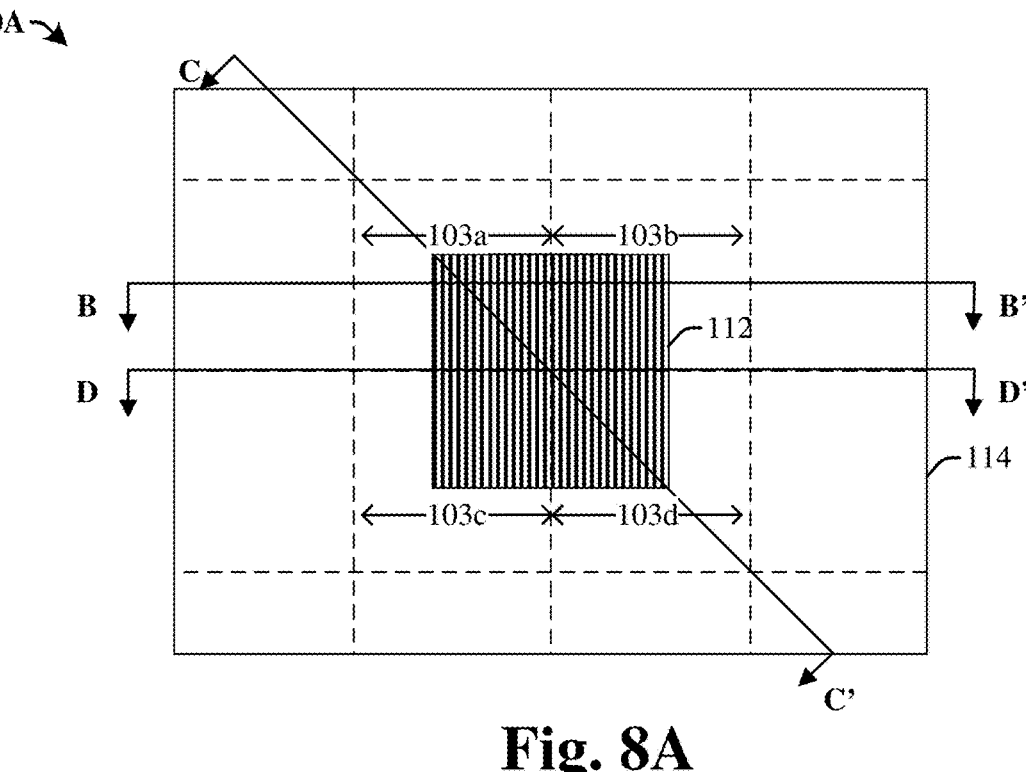
Figure 8B:
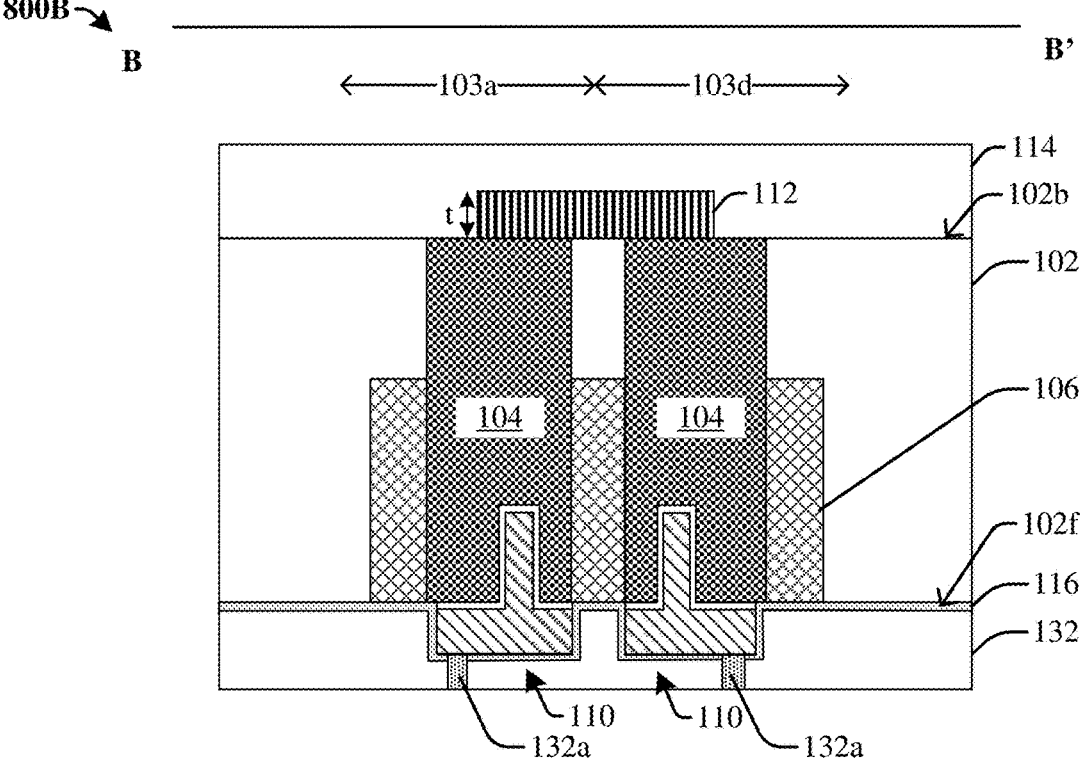
Figure 8C:
Figure 8C:
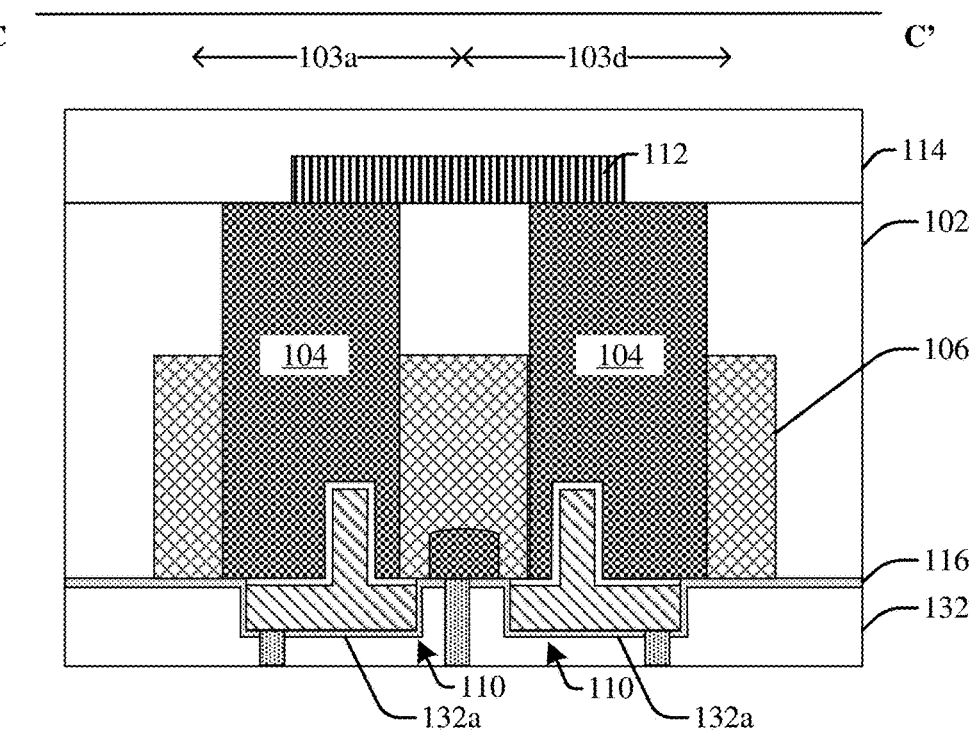
Figure 8D:
Figure 8D:
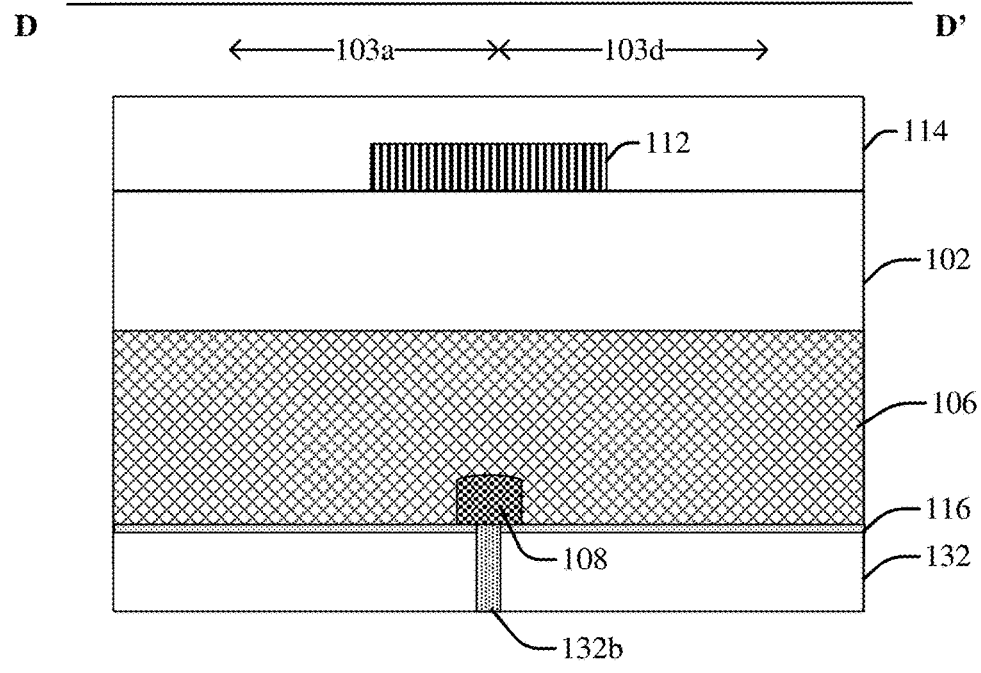

As shown in a top view 800A of FIG. 8A and cross-sectional views 800B-800D of FIGS. 8B-8D taken respectively along lines B-B', C-C', D-D' in the top view 800A, in some embodiments, the blocking layer 112 is formed and patterned on the backside 102b of the substrate 102 to cover regions defined to be the first BDTI component. The blocking layer 112 may be a square or rectangular shaped centered by the crossroad of the plurality of pixel regions 103a-103d. The blocking layer 112 may comprise dielectric material such as oxide (e.g. silicon dioxide). The blocking layer 112 may have a thickness tin a range of from about 200 Å to about 1000 Å. An example thickness of the blocking layer 112 is 400 Å. The thickness t of the blocking layer 112 may be determined based on the intended depth difference Δd of the first BDTI component 124a and the second BDTI component 124b to be formed (see, e.g., FIG. 12B).

Prior to forming the blocking layer, the substrate 102 may be thinned from the backside 102b to reduce a thickness of the substrate 102 and allow for radiation to pass through the backside 102b of the substrate 102 to the photodiode 104. In some embodiments, the substrate 102 may be thinned by etching or mechanical grinding the backside 102b of the substrate 102.

After forming the blocking layer 112, a hard mask 114 may be then formed over the backside 102b of the substrate overlying the blocking layer 112. The hard mask 114 may be formed by one or more deposition or spin-on processes of various polymer, dielectric, and/or metal materials. An example hard mask 114 may comprise a tri-layer structure including a carbon-based hard mask, a silicon contained hard mask and a photoresist stacked from bottom to top.

Figure 9A:
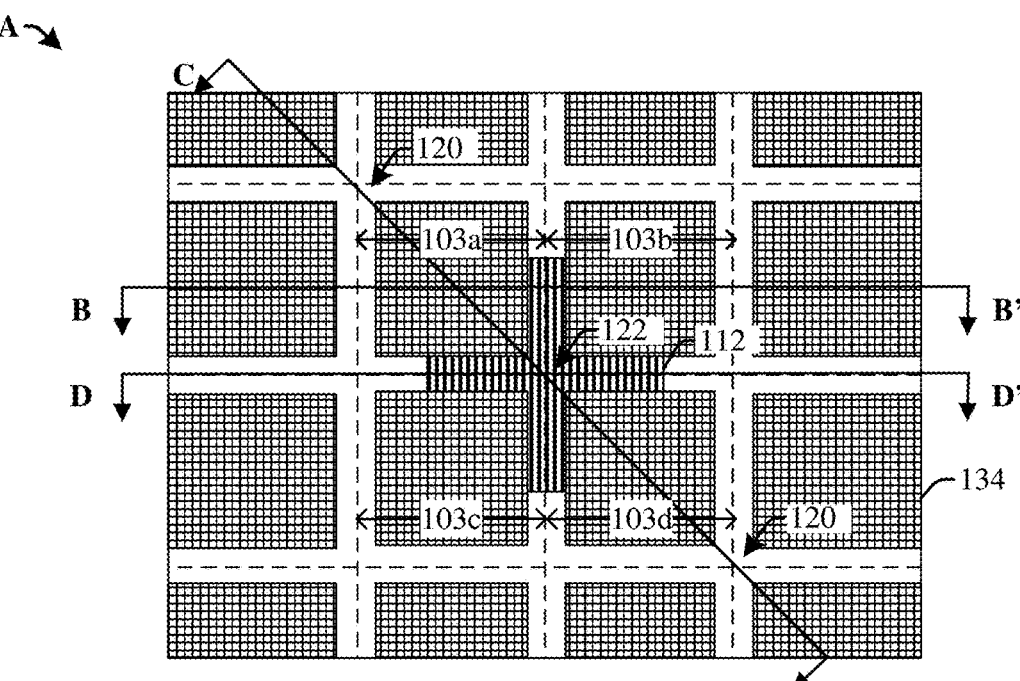
Figure 9B:
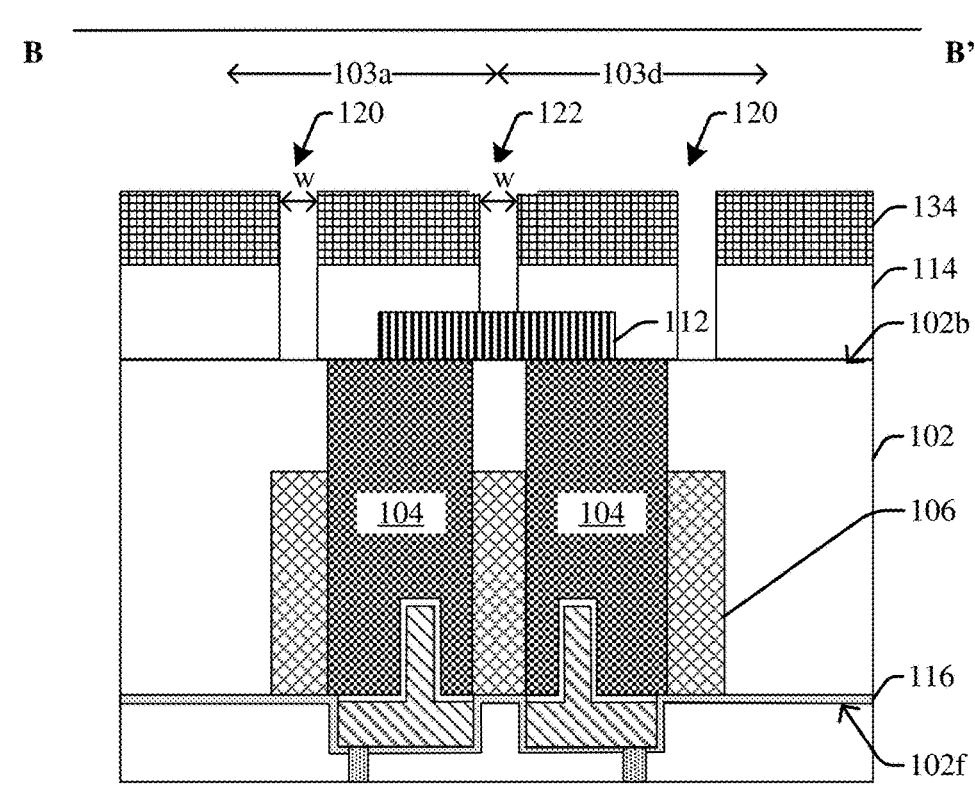
Figure 9C:
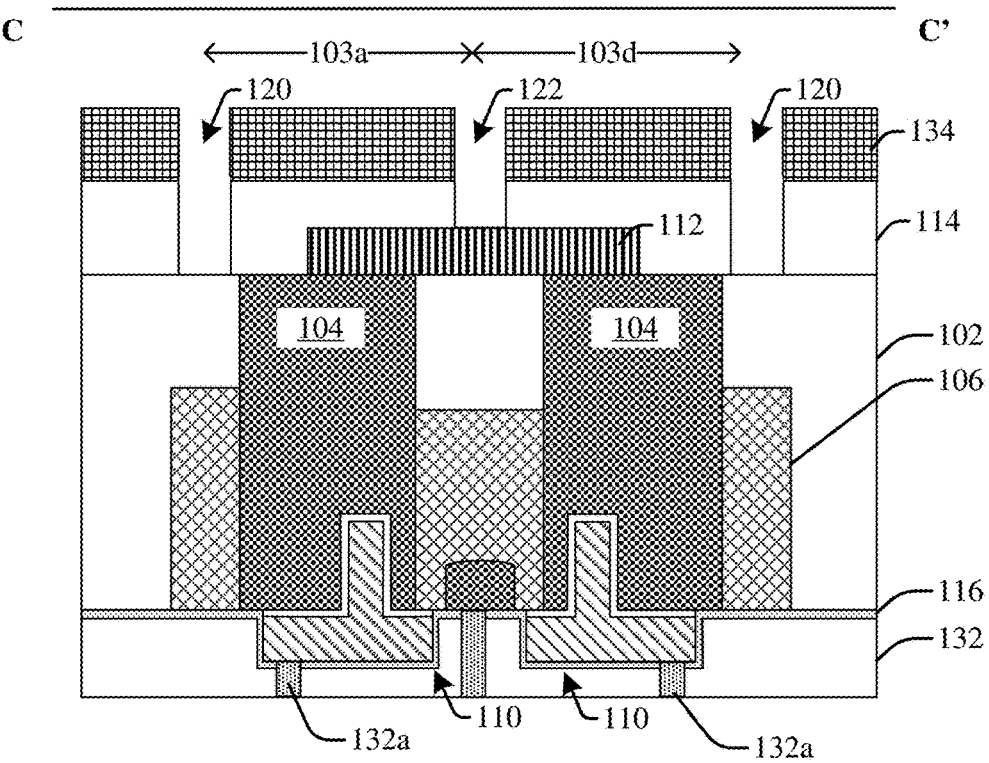
Figure 9D:
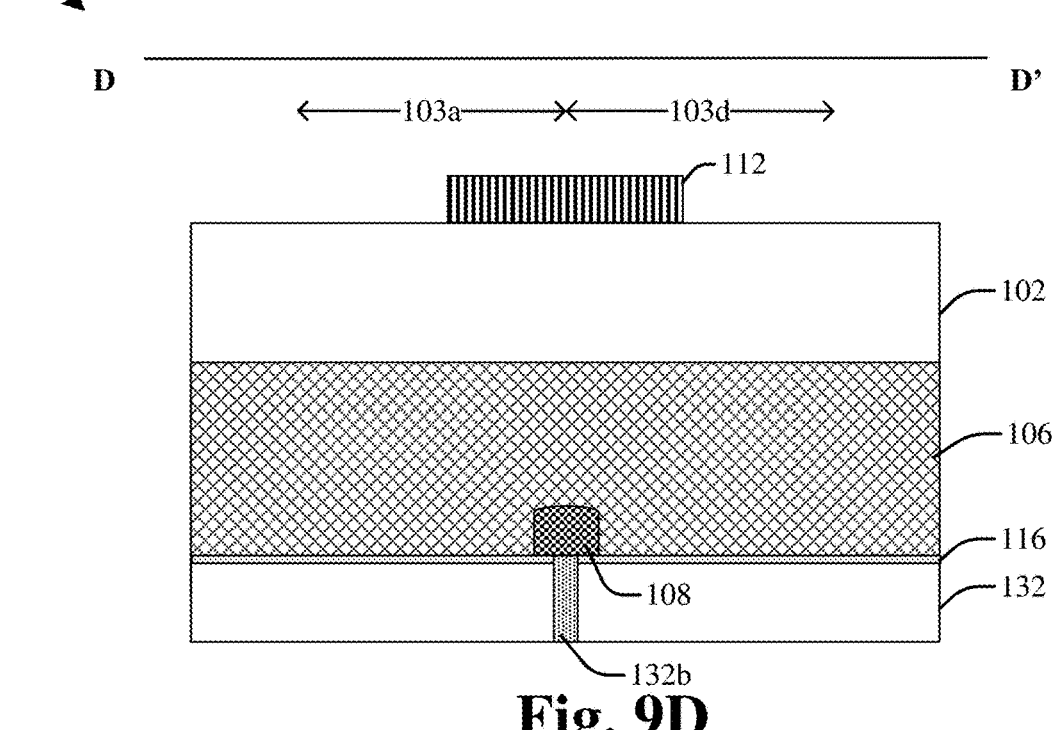

As shown in a top view 900A of FIG. 9A and cross-sectional views 900B-900D of FIGS. 9B-9D taken respectively along lines B-B', C-C', D-D' in the top view 900A, the hard mask 114 is subsequently patterned to form a BDTI trench separating the plurality of pixel regions 103a-103d. The hard mask 114 can be patterned by a photolithography process with a photoresist layer 134 patterned, followed by an etching process to etch the hard mask 114 according to the patterned photoresist layer 134. The BDTI trench may have a first portion 122 of a cross shape overlying and exposing the blocking layer 112 and a second portion 120 at remaining peripheries of the plurality of pixel regions 103a-103d. Since the first and second BDTI components 124a, 124b are defined using one mask and one photolithography process, overlapping and misalignment issues are eliminated. In some embodiments, the first and second portions 122, 120 of the BDTI trench are formed with the same w.

Figure 10A:
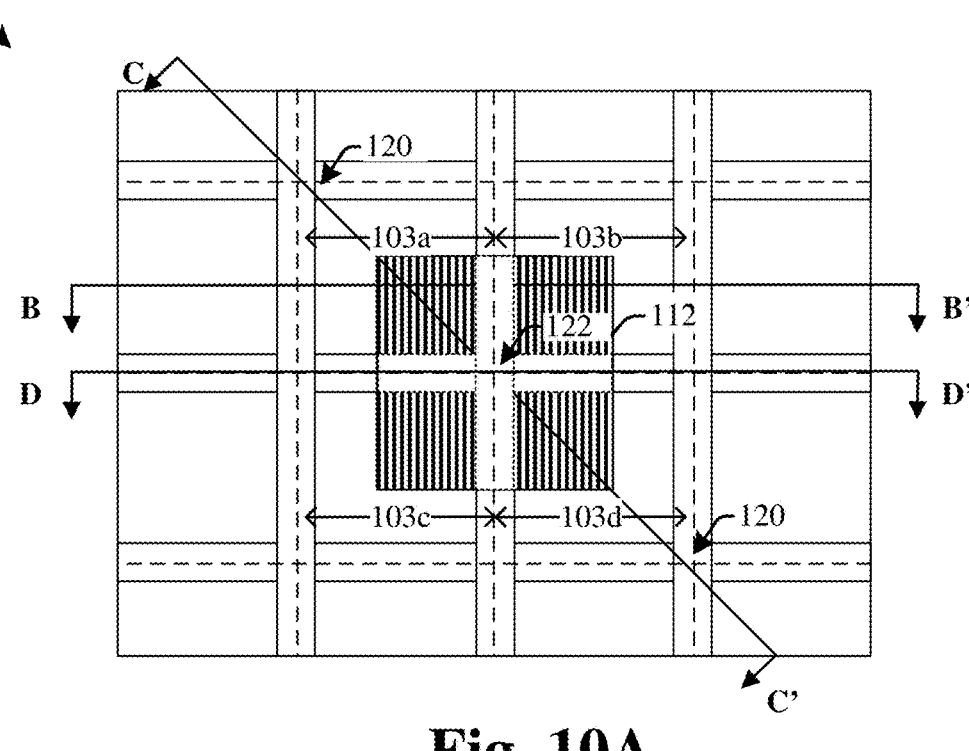
Figure 10B:
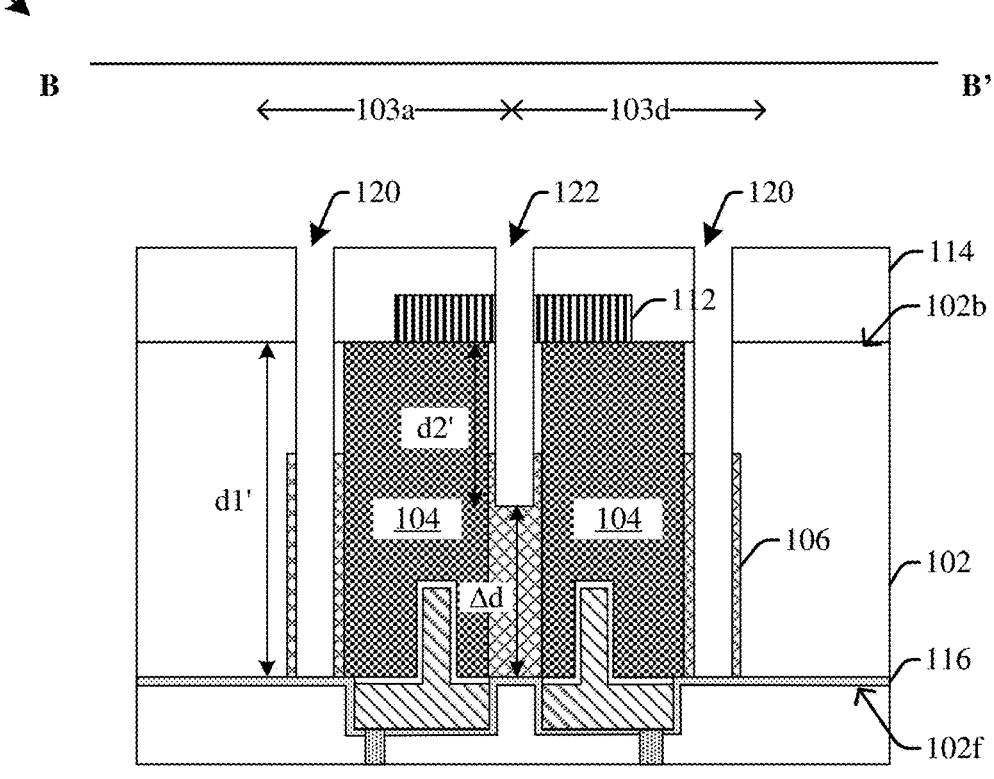
Figure 10C:
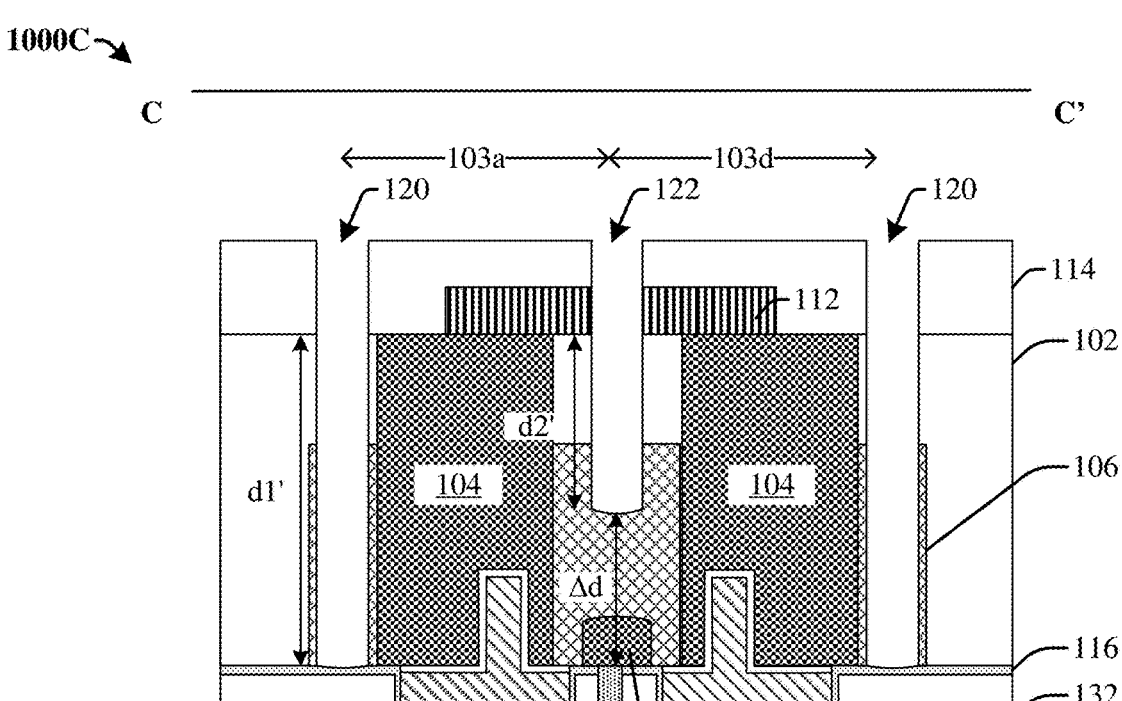
Figure 10D:
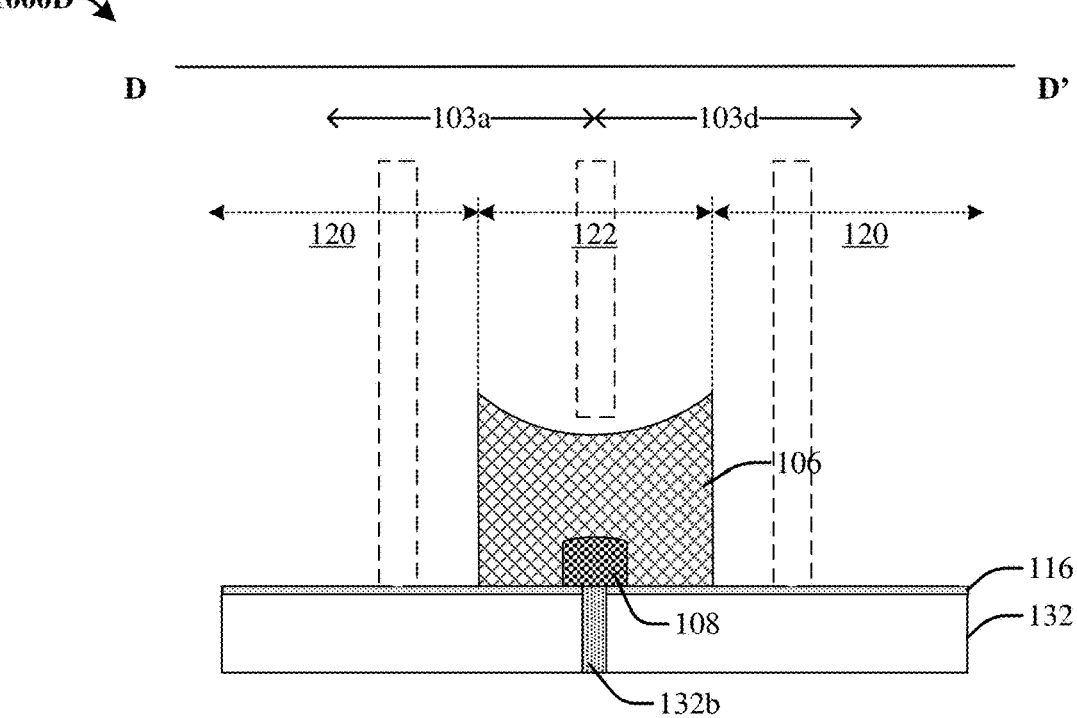

As shown in a top view 1000A of FIG. 10A and cross-sectional views 1000B-1000D of FIGS. 10B-10D respectively along lines B-B', C-C', D-D' in the top view 1000A, an etch is performed to deepen the BDTI trench into the substrate 102 according to the hard mask 114. The etch has different etch rates for the blocking layer 112 and the substrate 102. An etch rate is defined as a removal depth the etch achieves in a period of time. In some embodiments, an etch rate ratio of the BDTI trench etch of the substrate 102 and the blocking layer 112 may be in a range of from about 10:1 to about 30:1. A small etch rate ratio, such as an etch rate smaller than 10:1 may result insufficient depth difference Δd or a thick thickness of the blocking layer. A large etch rate ratio, such as an etch rate greater than 30:1 may result coarse control of the depth difference Δd. The thickness t of the blocking layer 112 may also be determined based on a BDTI trench etch rate ratio of the blocking layer 112 and the substrate 102. In various embodiments, the etch may comprise a dry etching process having an etching chemistry comprising a fluorine species (e.g., $CF_4$, $CHF_3$, $C_4F_8$, etc.) and/or a wet etchant (e.g., hydrofluoric acid (HF) or Tetramethylammonium hydroxide (TMAH)).

Since the blocking layer 112 is subject to a smaller etch rate, the deepening of the first portion 122 of the BDTI trench is retarded by the blocking layer 112. As a result, a second depth d2 is achieved for the first portion 122 smaller than a first depth d1 of the second portion 120. The first portion 122 may reach into the isolation well 106, but vertically spaced apart from the FD node 108.

The first portion 122 and the second portion 120 of the BDTI trench respectively has a greater depth in crossroad regions of the plurality of pixel regions 103a-103d than remaining peripheral regions due to microloading effect. In addition, in some embodiments, a bottom of the first portion 122 of the BDTI trench has a convex shape with the first depth monotonically decreases from a center region to a peripheral region of the cross shape. As described above, the center region and the peripheral region of the cross shape may correspond to a center region and a boundary region of the blocking layer 112.

Figures 11A, 11B:
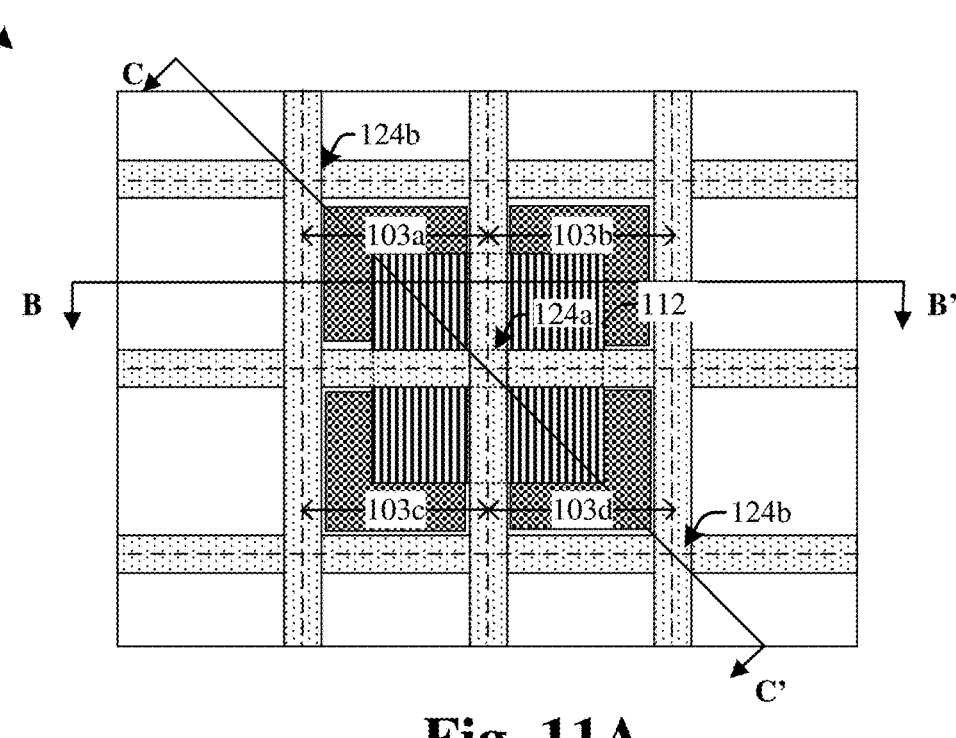
Figure 11C:
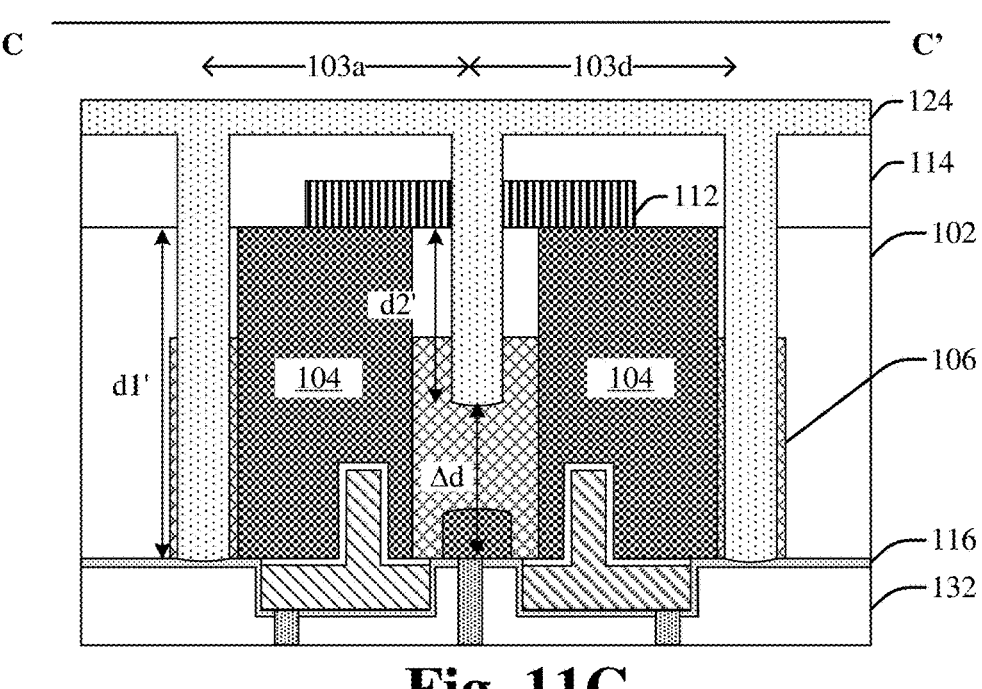
Figure 11D:
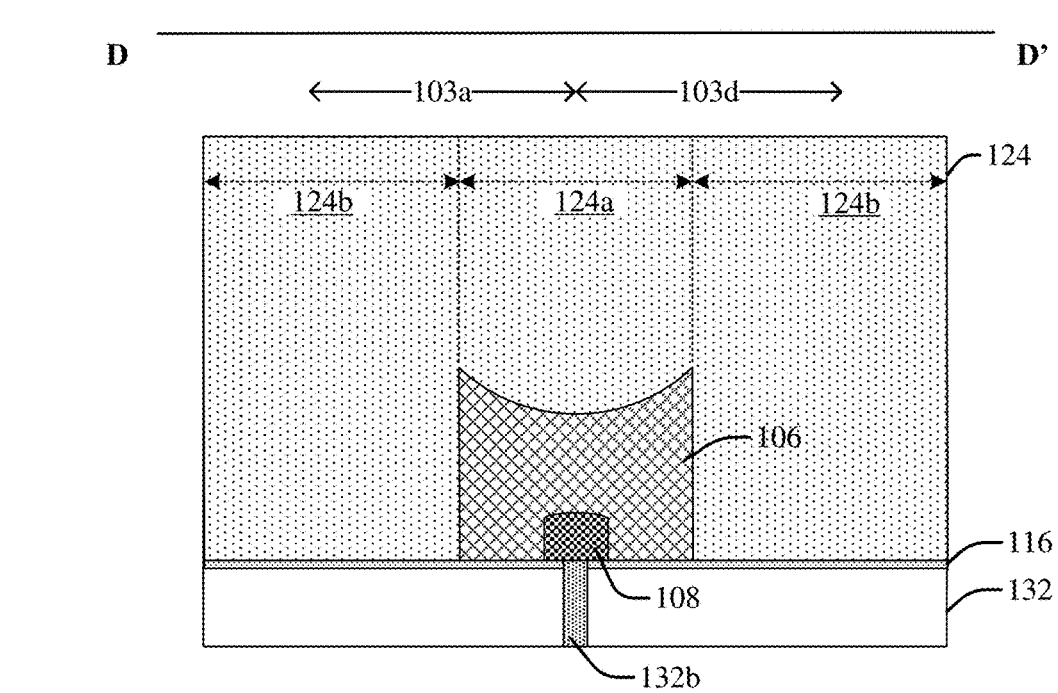

As shown in a top view 1100A of FIG. 11A and cross-sectional views 1100B-1100D of FIGS. 11B-11D taken respectively along lines B-B', C-C', D-D' in the top view 1100A, an isolation material is fill into the deepened BDTI trench to form BDTI structure 124 with the first and second BDTI components 124a, 124b of different depths d1, d2.

By arranging the blocking layer 112 prior to the forming and patterning of the hard mask 114, the first and second BDTI components 124a, 124b of the BDTI structure 124 can be formed using a photolithography process. Since the first and second BDTI components 124a, 124b are defined using one mask, overlapping and misalignment issues are eliminated.

Figure 12A:
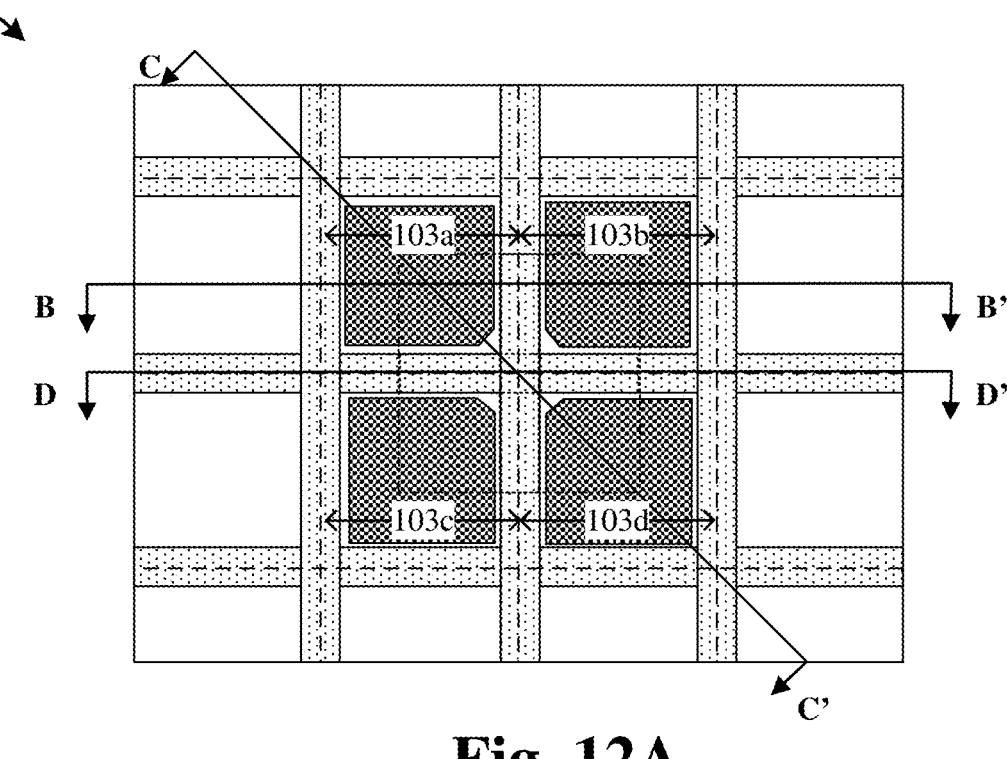
Figure 12B:
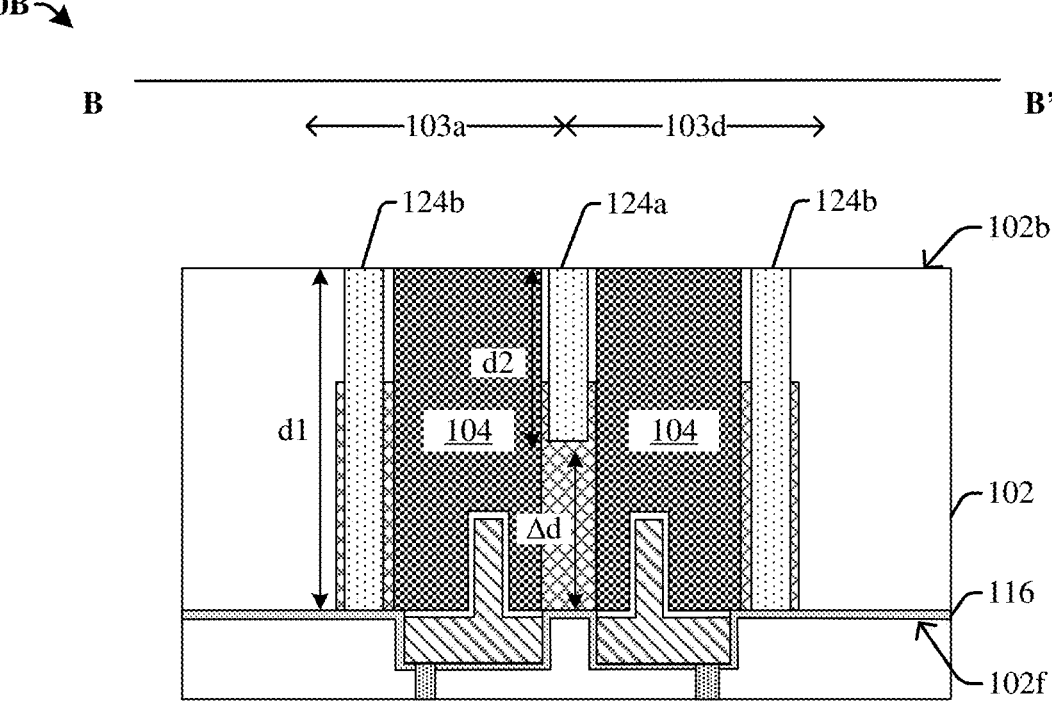
Figure 12C:
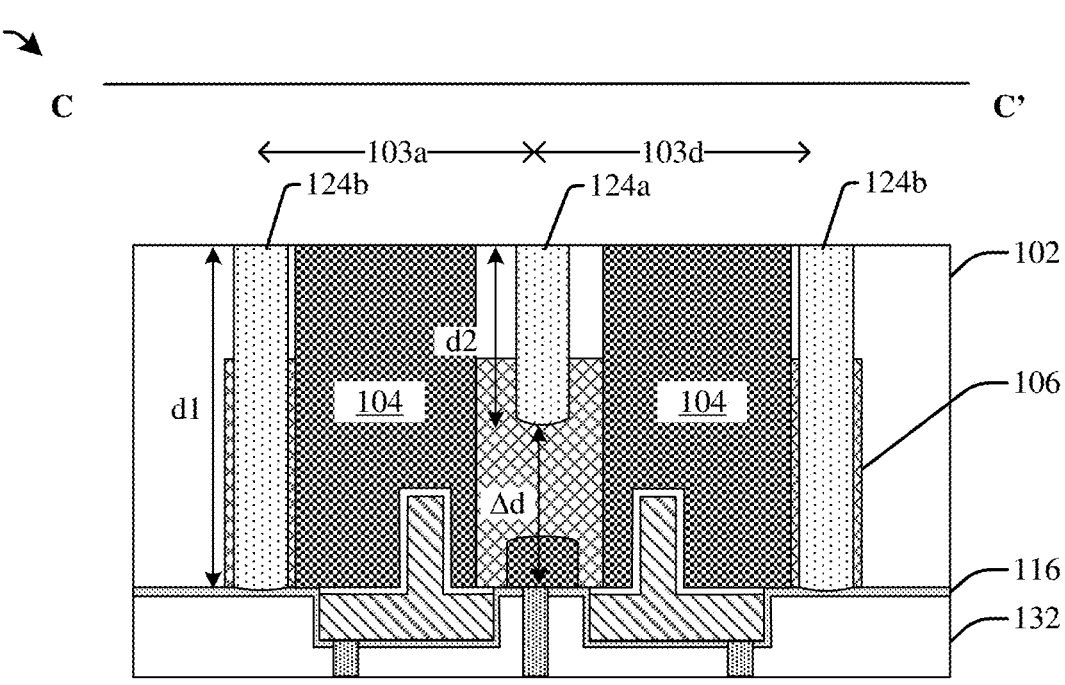
Figure 12D:
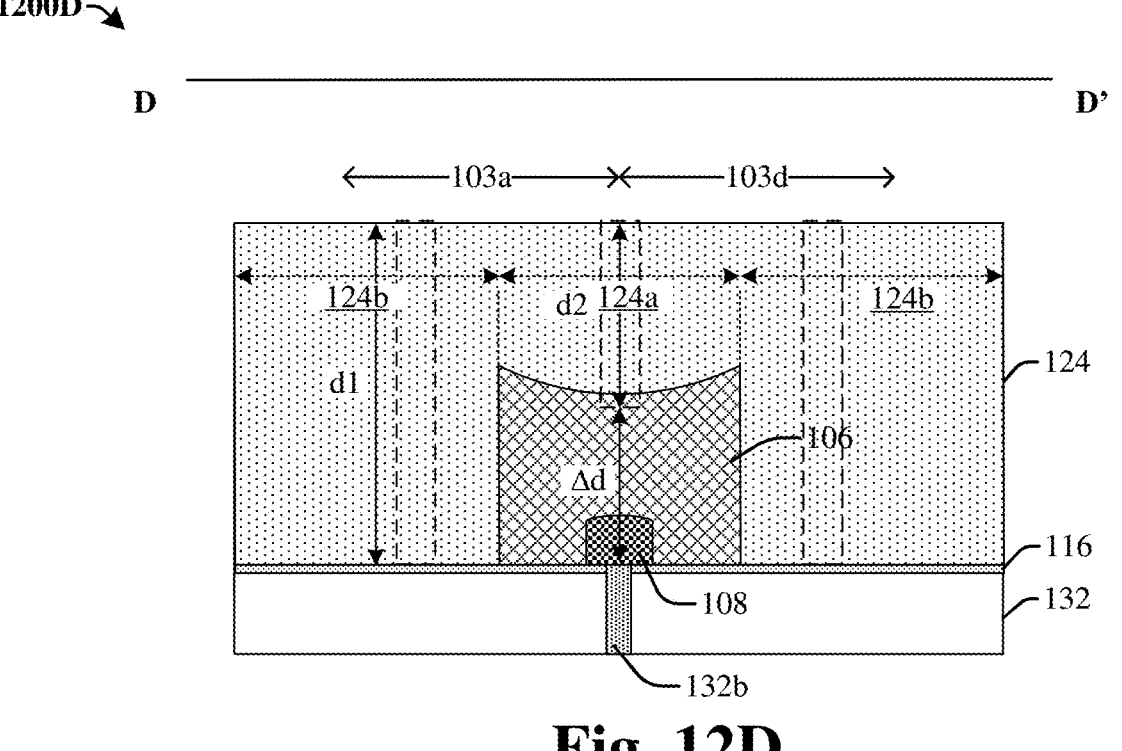

As shown in a top view 1200A of FIG. 12A and cross-sectional views 1200B-1200D of FIGS. 12B-12D taken respectively along lines B-B', C-C', D-D' in the top view 1200A, in some embodiments, a planarization process is performed to remove excessive isolation material to form a planar surface. The first portion 122 and the second portion 120 of the BDTI trench respectively has a greater depth in crossroad regions of the plurality of pixel regions 103a-103d than remaining peripheral regions due to microloading effect. In addition, in some embodiments, a bottom of the first portion 122 of the BDTI trench has a convex shape with the first depth monotonically decreases from a center region to a peripheral region of the cross shape. As described above, the center region and the peripheral region of the cross shape may correspond to a center region and a boundary region of the blocking layer 112.

In some alternative embodiments, the isolation material is etched for planarization, but still left to overlie the hard mask 114, the blocking layer 112, and the plurality of photodiodes 104. The resulted device structure can be illustrated by FIGS. 11A-11D with a suitable thickness of the BDTI structure 124 above the hard mask 114.

Figure 13A:
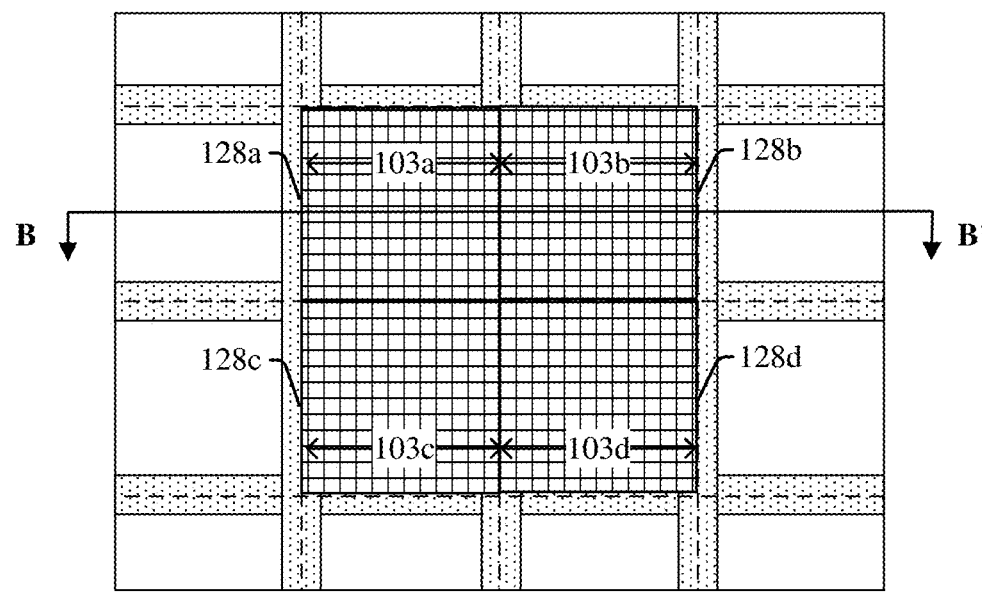
Figure 13B:
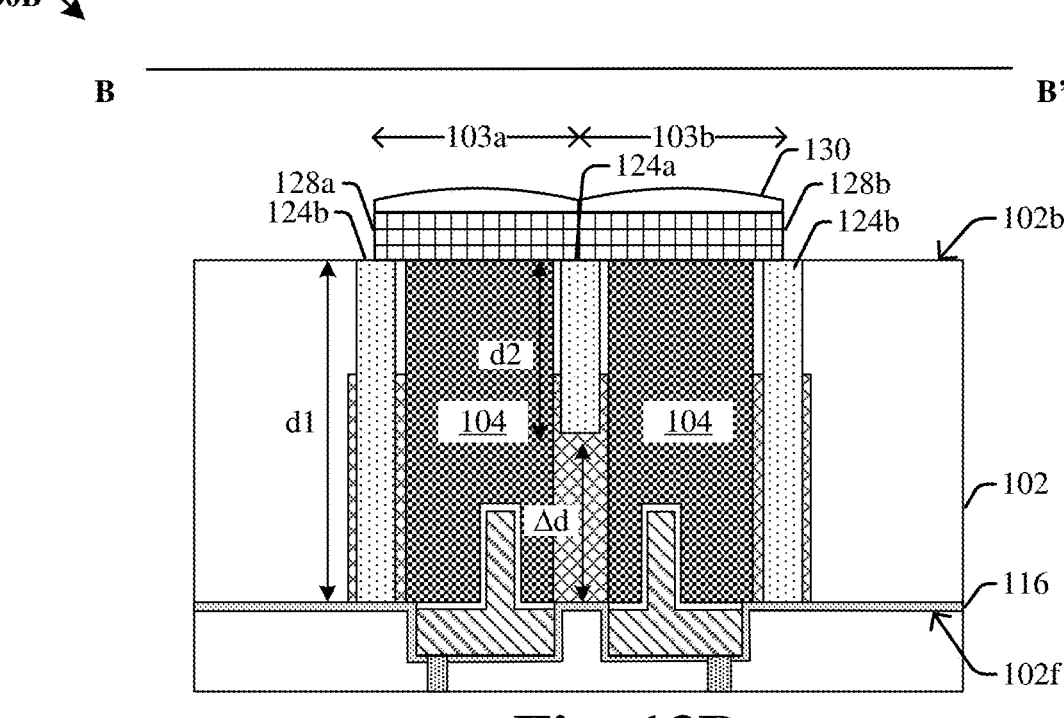

As shown in a top view 1300A of FIG. 13A and a cross-sectional view 1300B of FIG. 13B taken along line B-B' in the top view 1300A, in some embodiments, a plurality of color filters 128a-128d can be subsequently formed over the backside 102b of the substrate 102. In some embodiments, the plurality of color filters 128a-128d may be formed individually by forming and patterning respective color filter layers corresponding to the plurality of pixel regions 103a-103d. A color filter layer is a material that allows for the transmission of radiation (e.g., light) having a specific range of wavelength while blocking light of wavelengths outside of the specified range. A color filter isolation structure (not shown), such as a composite grid, may be formed separating the color filters 128a-128d for isolation purpose.

In addition, a plurality of micro-lenses 130 may be formed over the plurality of color filters 128a-128d. As an example, the plurality of micro-lenses may be formed by depositing a micro-lens material above the plurality of color filters 128a-128d (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses is then formed by selectively etching the micro-lens material according to the micro-lens template.

FIG. 14 illustrates a flow diagram of some embodiments of a method 1400 of forming an image sensor having a plurality of pixel regions separated from one another by a BDTI structure including first and second BDTI components of different depths.

While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a frontside of a substrate is prepared for forming an image sensor. Specifically, a plurality of photodiodes of a first doping type may be formed in a substrate respectively within a plurality of pixel regions arranged in rows and columns from a top view. A floating diffusion (FD) node of the first doping type may be formed from the frontside of the substrate at a crossroad of the plurality of pixel regions. See, for example, FIGS. 5A-5D. In some embodiments, a plurality of doped isolation wells of a second doping type opposite to the first doping type may be formed extending from the frontside of the substrate separating the plurality of pixel regions. See, for example, FIGS. 4A-4D. A plurality of transfer gates may be formed correspondingly between the plurality of photodiodes and the FD node. See, for example, FIGS. 6A-6D. In some further embodiments, an etch stop layer may be formed lining the frontside of the substrate configured to provide for etching stop of the second BDTI component to be formed. In some embodiments, the etch stop layer may be formed contouring sidewall and upper surfaces of the plurality of transfer gates. See, for example, FIGS. 7A-7D.

At act 1404, a blocking layer may be formed on a backside of the substrate defining the first BDTI component and configured to retard trench etching corresponding to the first BDTI component to be formed. The blocking layer may cover a crossroad of the plurality of pixel regions. See, for example, FIGS. 8A-8D.

At act 1406, a hard mask may be formed and patterned with a BDTI trench having a first portion directly above the blocking layer and a second portion at peripheries of the plurality of pixel regions. See, for example, FIGS. 9A-9D.

At act 1408, an etch may be performed according to the hard mask to deepen the first portion of the BDTI trench through the blocking layer to the first depth into the substrate and to deepen the second portion of the BDTI trench to the second depth into the substrate. As a result of the etch, a BDTI trench is formed including a first portion at the crossroad of pixel regions with the first depth smaller than the second depth of a second portion at remaining peripheries of pixel regions. The first portion of the BDTI trench may be formed to reach into the doped isolation wells but vertically spaced apart from the FD node. The second portion of the BDTI trench may be formed to reach into and stopped by the etch stop layer. The second portion of the BDTI trench may be formed through the substrate and have the second depth as a full depth of the substrate. See, for example, FIGS. 10A-10D.

At act 1410, an isolation material may be filled into the BDTI trench. The isolation material may comprise a stack of dielectric and metal layers. See, for example, FIGS. 11A-11D.

At act 1412, a planarization process may be performed to remove an excessive portion of the isolation material above the substrate. See, for example, FIGS. 12A-12D.

At act 1414, a plurality of color filters may be formed at the backside of the substrate corresponding to the plurality of photodiodes. The color filters may meet at interfaces overlying the first BDTI component and the second BDTI component of the BDTI structure. See, for example, FIGS. 13A-13B.

Therefore, the present disclosure relates to a new method of formation and corresponding device structure of an image sensor. The image sensor is formed to have pixel regions surrounded and isolated from one another by a BDTI structure comprising first and second BDTI components of different depths.

Accordingly, in some embodiments, the present disclosure relates to a method for forming an image sensor. The method includes forming a plurality of photodiodes of a first doping type in a substrate respectively within a plurality of pixel regions arranged in rows and columns from a top view. A backside deep trench isolation (BDTI) structure is formed in the substrate separating the plurality of pixel regions. The BDTI structure encloses the plurality of photodiodes and comprising a first BDTI component arranged at a crossroad of the plurality of pixel regions and a second BDTI component arranged at remaining peripheries of the plurality of pixel regions. The first BDTI component has a first depth from a backside of the substrate smaller than a second depth of the second BDTI component.

In other embodiments, the present disclosure relates to a method for forming an image sensor. The method includes forming a first photodiode in a first pixel region of a substrate and a second photodiode in a second pixel region of the substrate adjacent to the first pixel region. The first photodiode and the second photodiode are of a first doping type. A blocking layer is formed on a backside of the substrate between the first photodiode and the second photodiode. A hard mask is formed and patterned with a BDTI trench having a first portion directly above the blocking layer and a second portion respectively at opposite sides of the first photodiode and the second photodiode. An etch is performed to deepen the first portion of the BDTI trench through the blocking layer to a first depth into the substrate and to deepen the second portion of the BDTI trench to a second depth into the substrate, wherein the second depth is greater than the first depth. A backside deep trench isolation (BDTI) structure is formed by filling the first portion and the second portion of the BDTI trench to respectively form a first BDTI component having the first depth and a second BDTI component having the second depth.

In yet other embodiments, the present disclosure relates to image sensor including a plurality of photodiodes disposed in a substrate respectively within a plurality of pixel regions. A floating diffusion (FD) node extends into the substrate from a frontside of the substrate. The FD node is disposed at a crossroad of the plurality of pixel regions and shared amongst the plurality of pixel regions. A backside deep trench isolation (BDTI) structure extends from a backside of the substrate and separating the plurality of pixel regions, the BDTI structure comprising a first BDTI component arranged at a blocking region centering at the crossroad of the plurality of pixel regions and a second BDTI component arranged at remaining regions of peripheries of the plurality of pixel regions. The first BDTI component has a first depth smaller than a second depth of the second BDTI component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:

forming a plurality of photodiodes of a first doping type in a substrate respectively within a plurality of pixel regions arranged in rows and columns from a top view;

forming a blocking layer on a backside of the substrate covering an intersection of the plurality of pixel regions, wherein the blocking layer has a lateral side located between opposite sidewalls of the plurality of photodiodes;

performing an etch to form a backside deep trench isolation (BDTI) trench including etching through the blocking layer to a first depth within the substrate and etching to a second depth within the substrate at peripheries of the plurality of pixel regions, wherein the first depth is smaller than the second depth; and filling an isolation material into the BDTI trench to form a BDTI structure in the substrate separating the plurality of pixel regions, the BDTI structure enclosing the plurality of photodiodes and comprising a first BDTI component with the first depth arranged at the intersection of the plurality of pixel regions and a second BDTI component with the second depth arranged at remaining peripheries of the plurality of pixel regions.

2. The method of claim 1, wherein the BDTI trench is formed according to a hard mask having a first opening exposing the blocking layer and a second opening located at the remaining peripheries of the plurality of pixel regions.

3. The method of claim 1, wherein the first depth of the first BDTI component monotonically decreases from a center region to a boundary region.

4. The method of claim 1, wherein the filling of the isolation material comprises filling a stack of dielectric and metal layers into the BDTI trench.

5. The method of claim 1, wherein forming the BDTI structure further comprises:

performing a planarization process to remove an excessive portion of the isolation material above the substrate.

6. The method of claim 1, prior to the forming of the BDTI structure, further comprising:

forming an etch stop layer lining a frontside of the substrate; and wherein the BDTI structure is then formed with the second BDTI component reaching to the etch stop layer.

7. The method of claim 1, wherein the second BDTI component is formed through the substrate with the second depth being a full depth of the substrate.

8. The method of claim 1, prior to the forming of the BDTI structure, further comprising:

forming a floating diffusion (FD) node of the first doping type from a frontside of the substrate at the intersection of the plurality of pixel regions; and wherein the first BDTI component is formed overlying and spaced apart from the FD node.

9. The method of claim 8, prior to the forming of the BDTI structure, further comprising:

forming a plurality of doped isolation wells of a second doping type opposite to the first doping type extending from the frontside of the substrate separating the plurality of pixel regions; and wherein the BDTI structure is then formed reaching into the plurality of doped isolation wells.

10. The method of claim 1, further comprising:

forming a plurality of color filters at the backside of the substrate corresponding to the plurality of photodiodes, the plurality of color filters meeting at interfaces overlying the first BDTI component and the second BDTI component of the BDTI structure.

11. A method for forming an image sensor, the method comprising:

forming a first photodiode in a first pixel region of a substrate and a second photodiode in a second pixel region of the substrate adjacent to the first pixel region, wherein the first photodiode and the second photodiode are of a first doping type;

forming a blocking layer on a backside of the substrate between the first photodiode and the second photodiode, wherein the blocking layer partially covers a top surface of the first photodiode from a cross-sectional view;

forming and patterning a hard mask with a BDTI trench having a first portion directly above the blocking layer and a second portion respectively at opposite sides of the first photodiode and the second photodiode;

performing an etch to deepen the first portion of the BDTI trench through the blocking layer to a first depth into the substrate and to deepen the second portion of the BDTI trench to a second depth into the substrate, wherein the second depth is greater than the first depth; and forming a backside deep trench isolation (BDTI) structure by filling the first portion and the second portion of the BDTI trench to respectively form a first BDTI component having the first depth and a second BDTI component having the second depth.

12. The method of claim 11, wherein the first photodiode comprises opposite sidewalls defining a width of the photodiode, and wherein the blocking layer has a lateralmost point located between the opposite sidewalls.

13. The method of claim 11, further comprising:

forming a floating diffusion (FD) node of the first doping type from a frontside of the substrate between the first photodiode and the second photodiode; and wherein the blocking layer overlies the FD node.

14. The method of claim 13, wherein the first BDTI component is formed overlying and spaced apart from the FD node.

15. The method of claim 11, further comprising performing a planarization process to remove an excessive portion of the BDTI structure above the substrate, the hard mask, and the blocking layer.

16. A method, comprising:

forming a plurality of photodiodes within a plurality of pixel regions of a substrate;

forming a floating diffusion (FD) node extending into the substrate from a frontside of the substrate, wherein the FD node is formed at an intersection of the plurality of pixel regions;

forming a blocking layer on a backside of the substrate overlying the FD node;

performing an etch to form a backside deep trench isolation (BDTI) trench including etching through the blocking layer to a first depth within the substrate and etching to a second depth within the substrate at peripheries of the plurality of pixel regions, wherein the first depth is smaller than the second depth; and forming a BDTI structure by filling the BDTI trench to separate the plurality of pixel regions, the BDTI structure comprising a first BDTI component of the first depth arranged at the intersection of the plurality of pixel regions and a second BDTI component of the second depth arranged at remaining regions of the plurality of pixel regions.

17. The method of claim 16, wherein the first depth of the first BDTI component monotonically decreases from a center region to a boundary region of a blocking region.

18. The method of claim 16, wherein the first BDTI component is formed vertically spaced from the FD node.

19. The method of claim 16, wherein the first BDTI component is formed with a cross shape from a top view with the first depth monotonically decreasing from a center region to a peripheral region of the cross shape.

20. The method of claim 19, wherein the first BDTI component and the second BDTI component are formed separated from one another by a photodiode of the plurality of photodiodes from a first cross-sectional view and continuously connected from a second cross-sectional view.

\* \* \* \* \*